United States Patent
Hayashi et al.

(10) Patent No.: US 10,665,280 B2
(45) Date of Patent: May 26, 2020

(54) INFORMATION PROCESSING APPARATUS AND SEMICONDUCTOR INTEGRATED CIRCUIT DEVICE

(71) Applicant: Hitachi, Ltd., Tokyo (JP)

(72) Inventors: Masato Hayashi, Tokyo (JP); Masanao Yamaoka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/285,549

(22) Filed: Feb. 26, 2019

(65) Prior Publication Data

US 2019/0267065 A1    Aug. 29, 2019

(30) Foreign Application Priority Data

Feb. 27, 2018  (JP) ................. 2018-032961

(51) Int. Cl.
| G11C 11/00 | (2006.01) |
| G11C 11/16 | (2006.01) |
| G11C 11/56 | (2006.01) |
| G06F 9/50  | (2006.01) |
| G06N 7/00  | (2006.01) |
| G06F 7/58  | (2006.01) |
| H03K 19/00 | (2006.01) |

(52) U.S. Cl.
CPC .......... G11C 11/1659 (2013.01); G06F 7/588 (2013.01); G06F 9/5077 (2013.01); G06N 7/005 (2013.01); G11C 11/5607 (2013.01); H03K 19/0002 (2013.01)

(58) Field of Classification Search
CPC . G11C 11/1659; G11C 11/5607; G06F 7/588; G06F 7/005; G06F 9/5077
See application file for complete search history.

(56) References Cited

U.S. PATENT DOCUMENTS

| 9,588,911  | B2 * | 3/2017  | Yamaoka  | ............ G06F 13/1652 |
| 9,823,882  | B2 * | 11/2017 | Yamaoka  | ............ G11C 11/1659 |
| 9,946,513  | B2 * | 4/2018  | Hayashi  | .................. H01L 27/11 |
| 10,037,391 | B2 * | 7/2018  | Hayashi  | .................. G06F 30/20 |
| 2016/0063148 | A1 | 3/2016  | Hayashi et al. | |
| 2016/0065210 | A1 | 3/2016  | Yoshimura et al. | |

FOREIGN PATENT DOCUMENTS

| JP | 2016-051314 A | 4/2016 |
| JP | 2016-051351 A | 4/2016 |

* cited by examiner

*Primary Examiner* — Pho M Luu

(74) *Attorney, Agent, or Firm* — Mattingly & Malur, PC

(57) ABSTRACT

The information processing apparatus is provided with a plurality of spin units for storing spin states and searching for a predetermined state by updating a spin state of a spin unit based on spin states of other spin units. The information processing apparatus includes: a first semiconductor integrated circuit device in which a plurality of first spin units are formed; a second semiconductor integrated circuit device in which a second spin unit is formed; an inter-chip wire connecting the first semiconductor integrated circuit device and the second semiconductor integrated circuit device; and a transmitter connection unit connected to the inter-chip wire and simultaneously shared by the plurality of first spin units. The transmitter connection unit transmits a spin state of a spin unit of which the spin state is changed among the plurality of first spin units, to the second semiconductor integrated circuit device through the inter-chip wire.

14 Claims, 20 Drawing Sheets

SPIN UNIT 40

- SPIN
- INTERACTION COEFFICIENT
- EXTERNAL MAGNETIC FIELD COEFFICIENT

SPIN UNIT 40

- ⊕ SPIN
- ▭ INTERACTION COEFFICIENT
- ▢ EXTERNAL MAGNETIC FIELD COEFFICIENT

INFORMATION PROCESSING APPARATUS AND SEMICONDUCTOR INTEGRATED CIRCUIT DEVICE

CROSS-REFERENCE TO RELATED APPLICATION

The present application claims priority from Japanese application JP 2018-032961, filed on Feb. 27, 2018, the contents of which is hereby incorporated by reference into this application.

BACKGROUND OF THE INVENTION

1. Field of the Invention

The present invention relates to a semiconductor device, and more particularly, to a semiconductor device which is suitable to apply to an information processing apparatus and a semiconductor integrated circuit device, which perform a ground state search of a large-scale Ising model.

2. Description of Related Art

An Ising model is a model of statistical dynamics to explain behaviors of a magnetic substance. The Ising model is defined by spins having two values, that is, +1/−1 (or 0/1 or up/down), an interaction coefficient indicative of an interaction between the spins, and an external magnetic field coefficient for each spin.

Energy of the Ising model at the relevant time may be calculated from a spin alignment, the interaction coefficient, and the external magnetic field coefficient which are defined. An energy function of the Ising model may be generally represented by a following expression.

[Equation 1]

$$E(s) = -\sum_{i<j} J_{i,j}\sigma_i\sigma_j - \sum_i h_i\sigma_i \quad (1)$$

Here, $\sigma_i$ and $\sigma_j$ respectively denote values of i-th and j-th spins, $J_{i,j}$ denotes an interaction coefficient between the i-th and j-th spins, $h_i$ denotes an external magnetic field coefficient for the i-th spin, and $\sigma$ denotes a spin alignment.

In Equation 1, a first term is for calculating the energy resulting from an interaction between spins. Generally, the Ising model is expressed in an undirected graph and does not distinguish between an interaction from the i-th spin to the j-th spin and an interaction from the j-th spin to the i-th spin. Accordingly, in the first term, an influence of an interaction coefficient is calculated with respect to a combination of $\sigma_i$ and $\sigma_j$, which satisfy i<j. Also, a second term is for calculating the energy resulting from an external magnetic field for each spin.

A ground state search of the Ising model is an optimization problem to find a spin alignment that minimizes an energy function of the Ising model. It is known that when the range of an interaction coefficient and an external magnetic field coefficient is not limited, finding a ground state of the Ising model whose topology becomes a nonplanar graph is an NP-hard problem.

The ground state search of the Ising model is used not only to explain behaviors of a magnetic substance which is originally a target of the Ising model, but also for various uses. This may be because the Ising model is the simplest model based on interactions and also has the capability to express various phenomena resulting from interactions. For example, the degree of stress in a group such as a workplace organization or the like may be estimated by using the ground state search of the Ising model.

In addition, the ground state search of the Ising model corresponds to a maximum cut problem known as an NP-hard graph problem. Such a graph problem is widely applicable to, for example, a community search in social networks, segmentation for image processing, etc. Accordingly, the ground state search may be applied to such various problems when there is a solver to perform the ground state search.

Since obtaining of a ground state of an Ising model is an NP-hard problem as described above, using a von Neumann type computer is difficult in terms of calculation time. While an algorithm that introduces heuristics to increase the speed is suggested, there is suggested a method of obtaining the ground state of the Ising model at high speeds, without using the von Neumann computers, by calculation that utilizes physical phenomena more directly, that is, by using analogue computers.

In such a device, an alignment corresponding to a problem to be solved is required. In the Ising model, elements that represent each one of spins and an interaction between the relevant spin and another spin (hereinafter referred to as the "element units") are required corresponding to the number of spins in the Ising model for which the ground state should be searched. In consideration of the above, it is preferred that a solid state component such as a semiconductor device, which is capable of regularly arranging a plurality of element units, performs the ground state search of the Ising model. In particular, an array structure may be represented by a storage device, such as a dynamic random access memory (DRAM), a static random access memory (SRAM), or the like, and the element unit may have a simple structure such that accumulation ability is increased. Accordingly, in recent years, such a semiconductor device (semiconductor chip) has been developed by the applicant of the present application (for example, JP-A-2016-51314).

Meanwhile, in order to construct such a semiconductor device, for example, a semiconductor device capable of searching for a ground state of a large-scale Ising model including a plurality of spins, the number of element units corresponding to the number of spins needs to be mounted on a semiconductor chip, but such a semiconductor device has a large chip size and high manufacturing costs. Thus, when such a semiconductor device is to be realized, a plurality of semiconductor chips each having a certain number of element units may be connected. For example, JP-A-2016-51351 discloses that values indicating a state of nodes, which are retained by a necessary element unit, is transmitted and received to and from another semiconductor chip while sharing an inter-chip wire by means of time sharing.

However, it is desired to provide an information processing apparatus of low costs and high performance by reducing the amount of wiring between semiconductor chips and increasing a transmission and reception speed between chips.

SUMMARY OF THE INVENTION

A first aspect of the invention is to provide an information processing apparatus provided with a plurality of spin units for storing spin states and searching for a predetermined state by updating a spin state of a spin unit based on spin states of other spin units, the information processing apparatus including: a first semiconductor integrated circuit device in which a plurality of first spin units are formed; a second semiconductor integrated circuit device in which a second spin unit is formed; an inter-chip wire connecting the first semiconductor integrated circuit device and the second semiconductor integrated circuit device; and a transmitter connection unit connected to the inter-chip wire and simultaneously shared by the plurality of first spin units. The transmitter connection unit transmits a spin state of a spin unit of which the spin state is changed among the plurality of first spin units, to the second semiconductor integrated circuit device through the inter-chip wire.

A second aspect of the invention is to provide a semiconductor integrated circuit device having a spin array formed of a plurality of spin units, wherein each of the spin units includes: a first memory cell for storing a value expressing a state of one spin; a second memory cell for storing an interaction coefficient indicating an interaction from another spin interacting with the one spin; a logic circuit for determining a next state of the one spin based on a value representing a state of the other spin and the interaction coefficient; and a detection circuit for detecting whether the next state of the spin differs from a current spin state. The plurality of spin units share one transmitter connection unit, and the transmitter connection unit includes: a multiplexer for inputting contents of the first memory cells of the plurality of spin units and selecting one of the contents; and an arbiter for receiving, as inputs, outputs of the detection circuits of the plurality of spin units. The multiplexer selects one of the contents of the first memory cells according to an output of the arbiter and outputs the selected content to the outside of the semiconductor integrated circuit device.

According to the invention, it is possible to provide an information processing apparatus of low costs and high performance by reducing the amount of wiring between semiconductor chips and increasing a transmission and reception speed between chips.

DESCRIPTION OF EMBODIMENTS

According to an embodiment, a semiconductor device that is able to search for a ground state of a large-scale Ising model and is able to be manufactured easily at low costs is suggested. According to an example of the embodiment, in a semiconductor device including a plurality of spins and performing a ground state search of an Ising model, a configuration in which a transmission path is shared between a plurality of adjacent spins among the plurality of spins, the plurality of adjacent spins share a circuit for detecting a change in a spin value, the plurality of adjacent spins are spins that obtain a transmission right to sequentially transmit spin values to the transmission path by a set of a counter and a multiplexer, and a spin that obtained a transmission right and having a change in a spin value transmits the spin value to the transmission path is described.

First Embodiment

<Ising Model Extended to Directed Graph>

In the present embodiment, a model extended from an Ising model and represented by Equation 2 below will be hereinafter referred to as an Ising model.

[Equation 2]

$$E(s) = -\sum_{i \neq j} J_{i,j}\sigma_i\sigma_j - \sum_i h_i\sigma_i \qquad (2)$$

A difference between an Ising model represented by Equation 1 and a model represented by Equation 2 is that Equation 2 permits interactions as shown in a directed graph. Generally, the Ising model may be drawn as an undirected graph according to graph theory. This is because interactions of the Ising model do not distinguish between an interaction coefficient $J_{i,j}$ from an i-th spin to a j-th spin and an interaction coefficient $J_{j,i}$ from the j-th spin to the i-th spin.

Since the present invention may be applied even by extending the Ising model and distinguishing between $J_{i,j}$ and $J_{j,i}$, the Ising model which is formed into a directed graph is handled in the present embodiment. Incidentally, if the Ising model which is an undirected graph is to be handled by using the Ising model which is a directed graph, it may be done simply by defining the same interaction coefficient for two directions, that is, $J_{i,j}$ and $J_{j,i}$. In this case, even if the same model is used, a value of the energy of the energy function according to Equation 2 is twice as much as the energy of the energy function according to Equation 1.

<Overall Configuration of Information Processing Apparatus>

Figure 1:
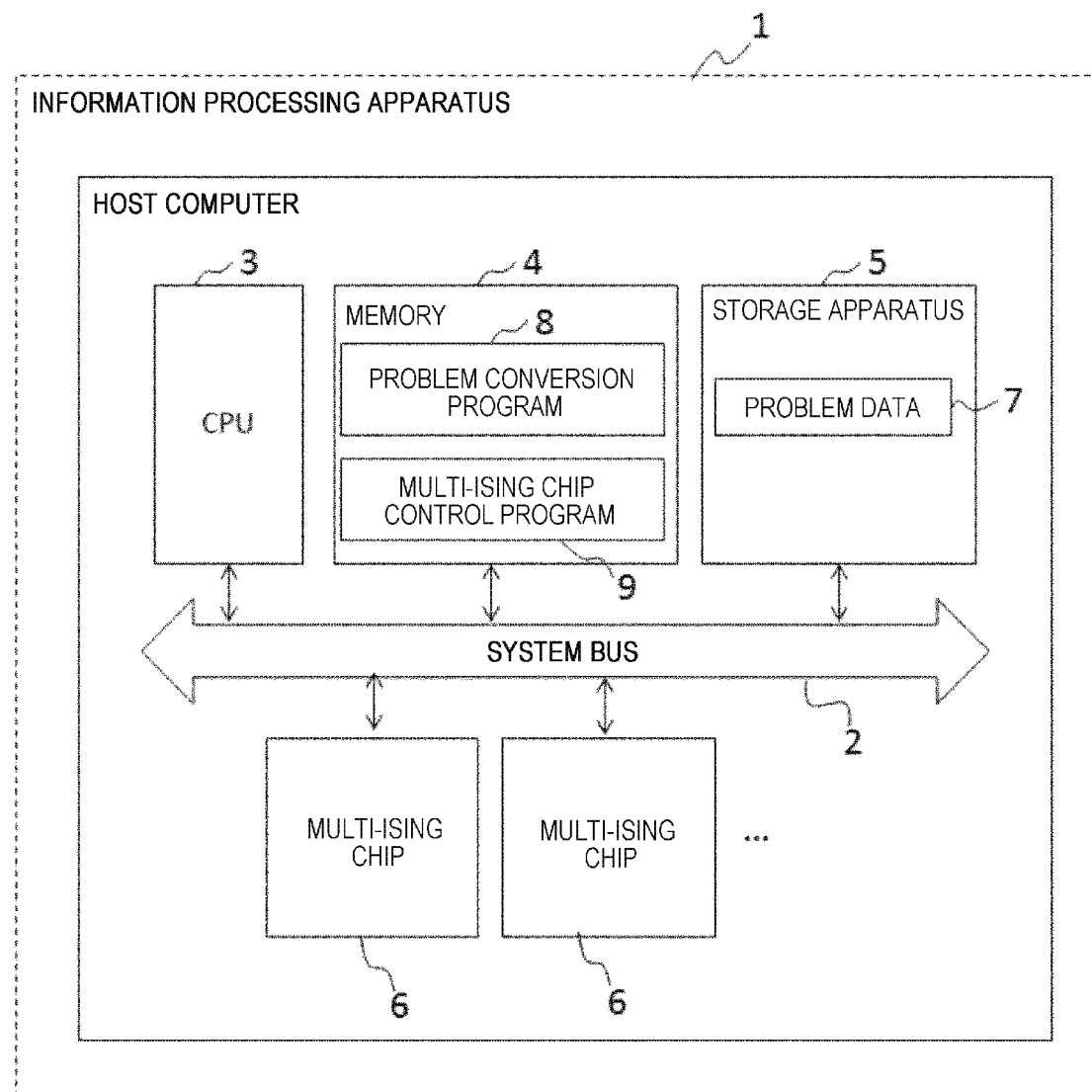
FIG. 1 is a block diagram showing an overall configuration of an information processing apparatus according to an embodiment.

FIG. 1 illustrates an overall configuration of an information processing apparatus according to the present embodiment. The information processing apparatus 1 is composed of, for example, a personal computer, a workstation, a server, or the like; and includes a CPU 3, a memory 4, a storage apparatus 5, and a single or a plurality of multi-Ising chips 6, which are connected via a system bus 2.

The storage apparatus 5 stores problem data 7 which is a single problem to be solved by the information processing unit 1; and the memory 4 stores a problem conversion program 8 and a multi-Ising chip control program 9. The problem conversion program converts such a problem into a single problem of an Ising model format as necessary and divides the problem of the Ising model format into a plurality of partial problems as necessary and assigns these partial problems to the individual multi-Ising chips 6, respectively. Furthermore, the multi-Ising chip control program 9 is a program for controlling solving of the partial problems handled by the individual multi-Ising chips 6. Incidentally, a partial problem itself is a single problem of the Ising model format independent from other partial problems.

The multi-Ising chip 6 is dedicated hardware for performing a ground state search of Ising models and, for example, takes a form of an expansion card to be mounted in the information processing unit 1 like a GPU (Graphics Processing Unit) which is dedicated hardware for screen plotting processing.

Figure 2:
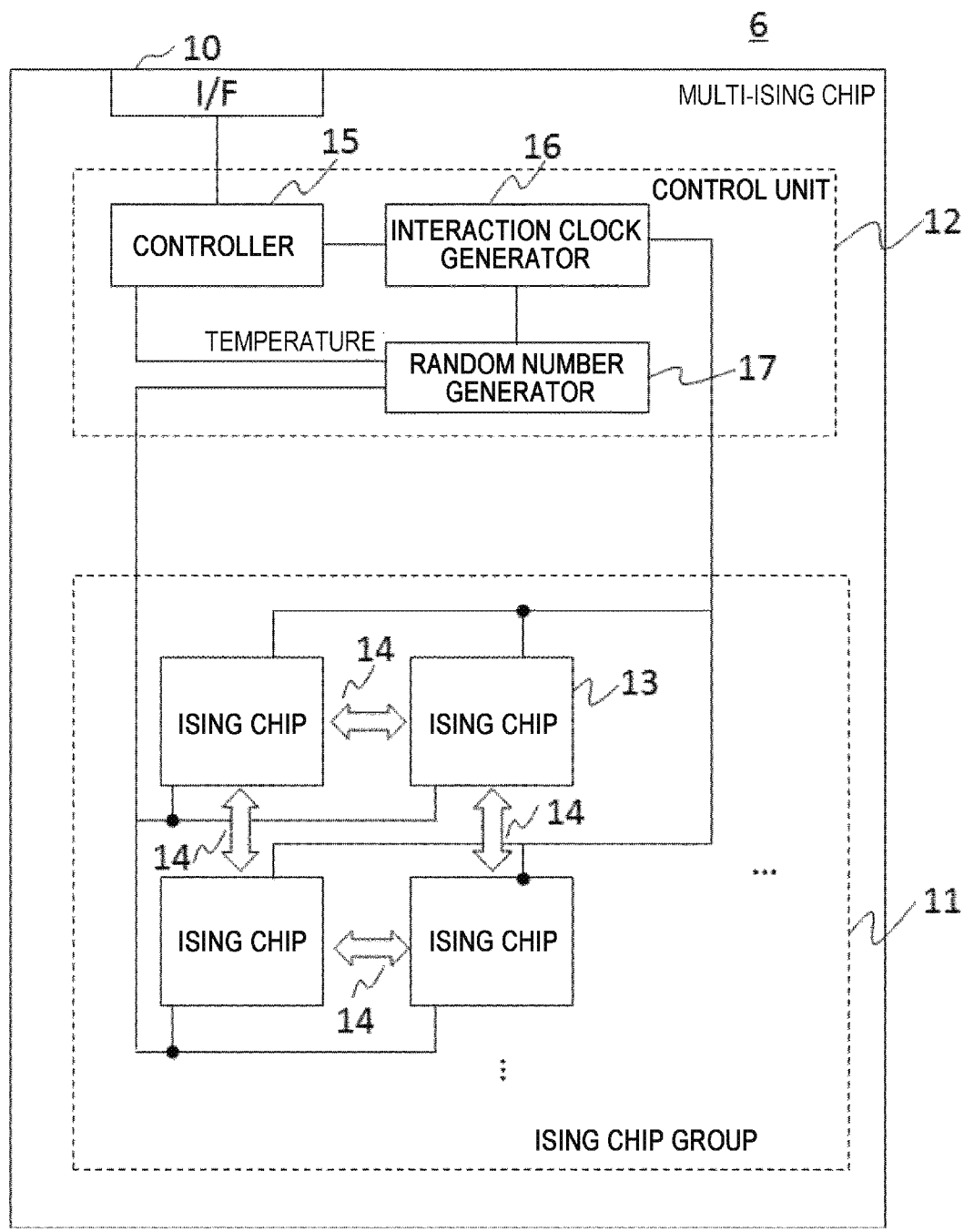
FIG. 2 is a block diagram showing a configuration of a multi-Ising chip.

FIG. 2 is a block diagram showing a configuration example of the multi-Ising chip 6 of the information processing apparatus 1. As shown in FIG. 2, the multi-Ising chip 6 is configured by including an interface 10, an Ising chip group 11, and a control unit 12, and transmits and receives commands and information to and from the CPU 3 (FIG. 1) via the interface 10 and the system bus 2 (FIG. 1).

The Ising chip group 11 is composed of a plurality of Ising chips 13, each of which is dedicated hardware that performs ground state search of an Ising model. The Ising chips 13 are connected each other with an inter-chip wire 14 and the Ising chips 13 transmit and receive necessary data to and from each other through the inter-chip wire 14.

The control unit 12 has a function that controls each of the Ising chips 13 constituting the Ising chip group 11 and is configured by including a controller 15, an interaction clock generator 16, and a random number generator 17.

The controller 15 is a processor for controlling an operation of the entire multi-Ising chip 6 and controls an operation of each of the Ising chips 13 constituting the Ising chip group 11 in accordance with commands transmitted from the CPU 3 (FIG. 1) of the information processing unit 1 through the system bus 2 (FIG. 1) and the interface 10, and also controls the interaction clock generator 16 and the random number generator 17.

Furthermore, the interaction clock generator 16 is a clock generator that generates an interaction clock described later. The interaction clock generated by the interaction clock generator 16 is transmitted to each of the Ising chips 13 constituting the Ising chip group 11. The random number generator 17 generates a random number composed of a random bit string to prevent a ground state search executed by each Ising chip 13 as described later from falling into a local optimal solution. Each random number generated by the random number generator 17 is transmitted to each Ising chip 13.

<Configuration of Ising Chip>

Figure 3:
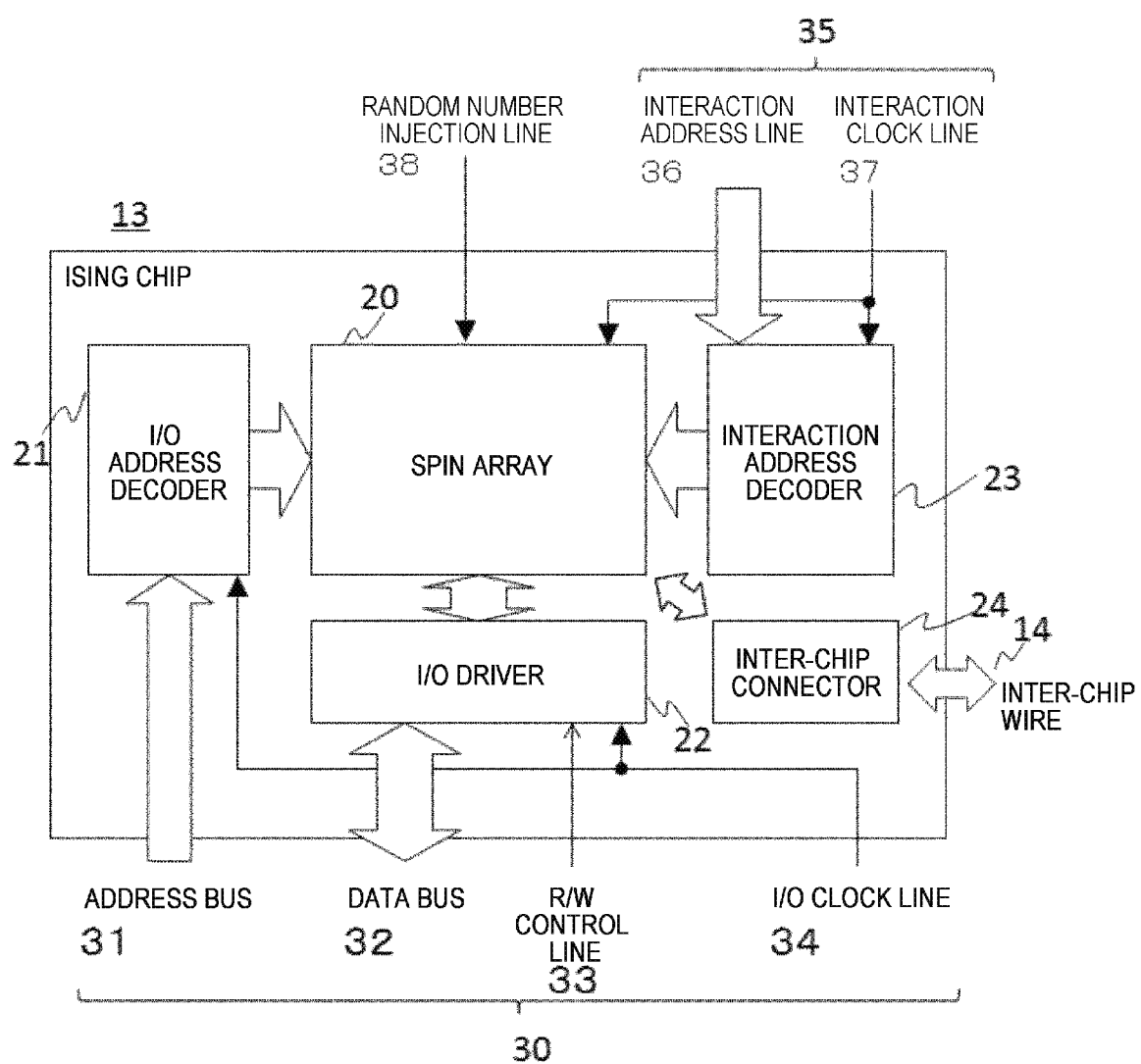
FIG. 3 is a block diagram showing a configuration of an Ising chip.

FIG. 3 illustrates a schematic configuration of the Ising chip 13. As shown in FIG. 3, the Ising chip 13 is configured by including a spin array 20, an I/O (Input/Output) address decoder 21, an I/O driver 22, an interaction address decoder 23, and an inter-chip connector 24. The present embodiment will be explained by assuming that the Ising chip 13 is mounted as a CMOS (Complementary Metal-Oxide Semiconductor) integrated circuit which is currently widely known; however, other types of solid-state component are also feasible.

The Ising chip 13 includes, as an SRAM compatibility interface 30 for reading/writing data from/to the spin array 20, an address bus 31, a data bus 32, an R/W control line 33, and an I/O clock line 34. The Ising chip 13 also includes, as an interaction control interface 35 for controlling the ground state search of the Ising model, an interaction address line 36 and an interaction clock line 37.

The Ising chip 13 expresses all of a spin $\sigma_i$, an interaction coefficient $J_{i,j}$, and an external magnetic field coefficient $h_i$ of the Ising model with information stored in memory cells in the spin array 20. Setting of an initial state of the spin $\sigma_i$ and reading of a solution after completion of the ground state search are performed through the SRAM compatibility interface 30. Furthermore, with the Ising chip 13, reading/writing of the interaction coefficient $J_{i,j}$ and the external magnetic field coefficient $h_i$ to set the Ising model, whose ground state should be searched, to the spin array 20 is also performed via the SRAM compatibility interface 30.

Therefore, an address is assigned to the spin $\sigma_i$, the interaction coefficient $J_{i,j}$, and the external magnetic field coefficient $h_i$ of the spin array 20. Then, when the spin $\sigma_i$, the interaction coefficient $J_{i,j}$, or the external magnetic field coefficient $h_i$ is read from or written to the Ising chip 13, the relevant address is given from the controller 15 to the I/O address decoder 21 via the address bus 31 and an R/W control signal for controlling reading/writing of the spin $\sigma_i$, the interaction coefficient $J_{i,j}$, and the external magnetic field coefficient $h_i$ is given from the controller 15 via the R/W control line 33 to the I/O driver 22.

Consequently, the I/O address decoder 21 activates a word line in the spin array 20 based on the address given via the address bus 31 and the I/O driver 22 activates a corresponding bit line in the spin array 20 based on the R/W control signal given via the R/W control line 33. As a result, an initial value of the spin $\sigma_i$ and set values of the interaction coefficient $J_{i,j}$ and the external magnetic field coefficient $h_i$ are set to the spin array 20 or the solution after completion of the ground state search is read from the spin array 20 and output externally via the data bus 32.

Incidentally, the address bus 31, the data bus 32, and the R/W control line 33 which constitute the SRAM compatibility interface 30 operate in synchronization with an I/O clock transmitted from the control unit 12 to the Ising chip 13 via the I/O clock line 34. However, according to the present invention, an interface does not have to be synchronous and may be asynchronous. The present embodiment will be explained on the premise that an interface is synchronous.

Furthermore, the Ising chip 13 implements interactions between spins within the spin array 20 in order to perform the ground state search. The interaction control interface 35 is used to control such interactions from outside. In particular, the Ising chip 13 inputs an address, which is given from the controller 15 to designate a spin group for performing the interaction, via the interaction address line 36 and performs the interaction in synchronization with the interaction clock which is input from the interaction clock generator 16 via the interaction clock line 37. The interaction address decoder 23 reads/writes the interaction coefficient $J_{i,j}$ and the external magnetic field coefficient $h_i$ from/to the spin array 20 based on the address given via the interaction address line 36.

In addition, the Ising chip 13 includes a random number injection line 38 that injects a random number to stochastically invert a value of a memory cell which represents spins in the Ising model as described later. The random number generated by the random number generator 17 described earlier with reference to FIG. 2 is supplied via the random number injection line 38 to the spin array 20.

The inter-chip connector 24 functions as an interface when transmitting/receiving the value of necessary spin $\sigma_i$ between the Ising chips 13 located adjacent to each other by using the inter-chip wire 14. The details of the inter-chip connector 24 will be described later.

<Configuration of Spin Array>

The spin array 20 is configured so that a plurality of spin units are arranged as element units where each spin unit retains one spin $\sigma_i$ and its associated interaction coefficient $J_{i,j}$ and external magnetic field coefficient $h_i$ and implements a ground state search operation.

Figure 4:
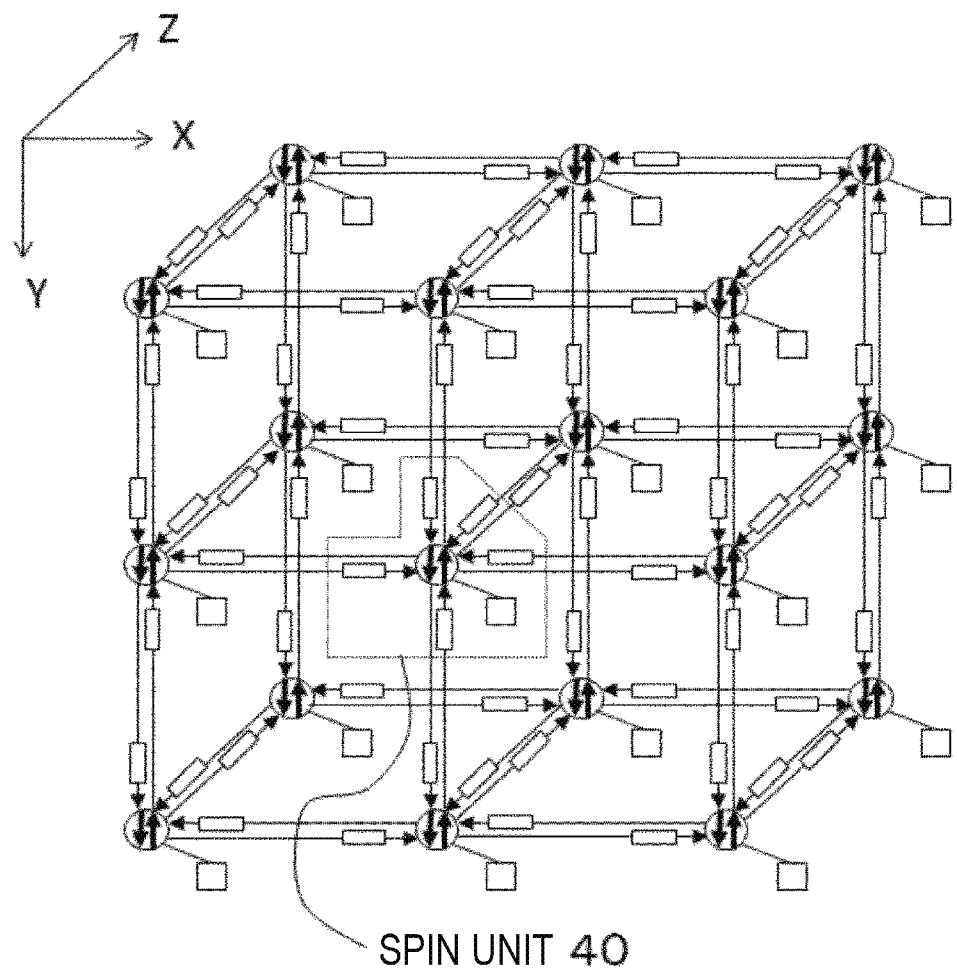
FIG. 4 is a conceptual diagram for explaining an Ising model.

FIG. 4 shows an example in which an Ising model having a three-dimensional lattice topology is configured by arranging a plurality of spin units 40. In other words, a function of the spin array 20 is conceptually illustrated. The example in FIG. 4 is a three-dimensional lattice of a 3 (X-axis direction)×3 (Y-axis direction)×2 (Z-axis direction) size. Coordinate axes are defined as illustrated in the drawing so that the right direction in the drawing is an X-axis, the downward direction in the drawing is a Y-axis, and the depthwise direction in the drawing is a Z-axis; however, these coordinate axes are defined as necessary merely for the convenience of easy explanation of the embodiment and are irrelevant to the present invention. When a topology other than the three-dimensional lattice such as a tree-shaped topology is used, the number of steps of the tree will be used to represent positions separately from the coordinate axes. When interactions between the spins are interpreted as a graph in the three-dimensional-lattice-shaped topology in FIG. 4, a spin of order 5 at maximum (vertex) will be required. Incidentally, when connection of the external magnetic field coefficient is also taken into consideration, order 6 at maximum will be required.

Values of adjacent spins (for example, in a case of five adjacent spins $\sigma_j, \sigma_k, \sigma_l, \sigma_m,$ and $\sigma_n$) are input to one spin unit 40 shown in FIG. 4. Therefore, the spin unit 40 has memory cells to retain these adjacent spin values to be input. The spin unit 40 also has memory cells to retain, in addition to the above spin values, the external magnetic field coefficient and interaction coefficients with the above adjacent spins (the interaction coefficients $J_{j,i}, J_{k,i}, J_{l,i}, J_{m,i}, J_{n,i}$ with the five adjacent spins), respectively.

Meanwhile, an Ising model has interactions generally represented by an undirected graph as described earlier. The Equation 1 includes $J_{i,j} \times \sigma_i \times \sigma_j$ as a term representing an interaction, which indicates an interaction from the i-th spin to the j-th spin. In this case, a general Ising model does not distinguish between the interaction from the i-th spin to the j-th spin and an interaction from the j-th spin to the i-th spin. In other words, $J_{i,j}$ and $J_{j,i}$ are the same. However, with the Ising chip 13 according to the present embodiment, the Ising model is extended to a directed graph (Equation 2) as described earlier and realizes asymmetric interactions, that is, the interaction from the i-th spin to the j-th spin and the interaction from the j-th spin to the i-th spin. As a result, model representation capability enhances, thereby making it possible to represent many problems with small-scale models.

Therefore, when one spin unit is the i-th spin $\sigma_i$, the interaction coefficients $J_{j,i}, J_{k,i}, J_{l,i}, J_{m,i}, J_{n,i}$ retained by this spin unit 40 determine interactions from the adjacent j-th, k-th, l-th, m-th, and n-th spins $\sigma_j, \sigma_k, \sigma_l, \sigma_m, \sigma_n$ to the i-th spin $\sigma_i$. This corresponds to the fact that arrows (interactions) corresponding to the interaction coefficients included in the spin unit 40 in FIG. 4 are directed from spins outside the spin unit 40 shown in the drawing towards spins inside the spin unit 40.

<Configuration of Spin Unit>

Figure 5:
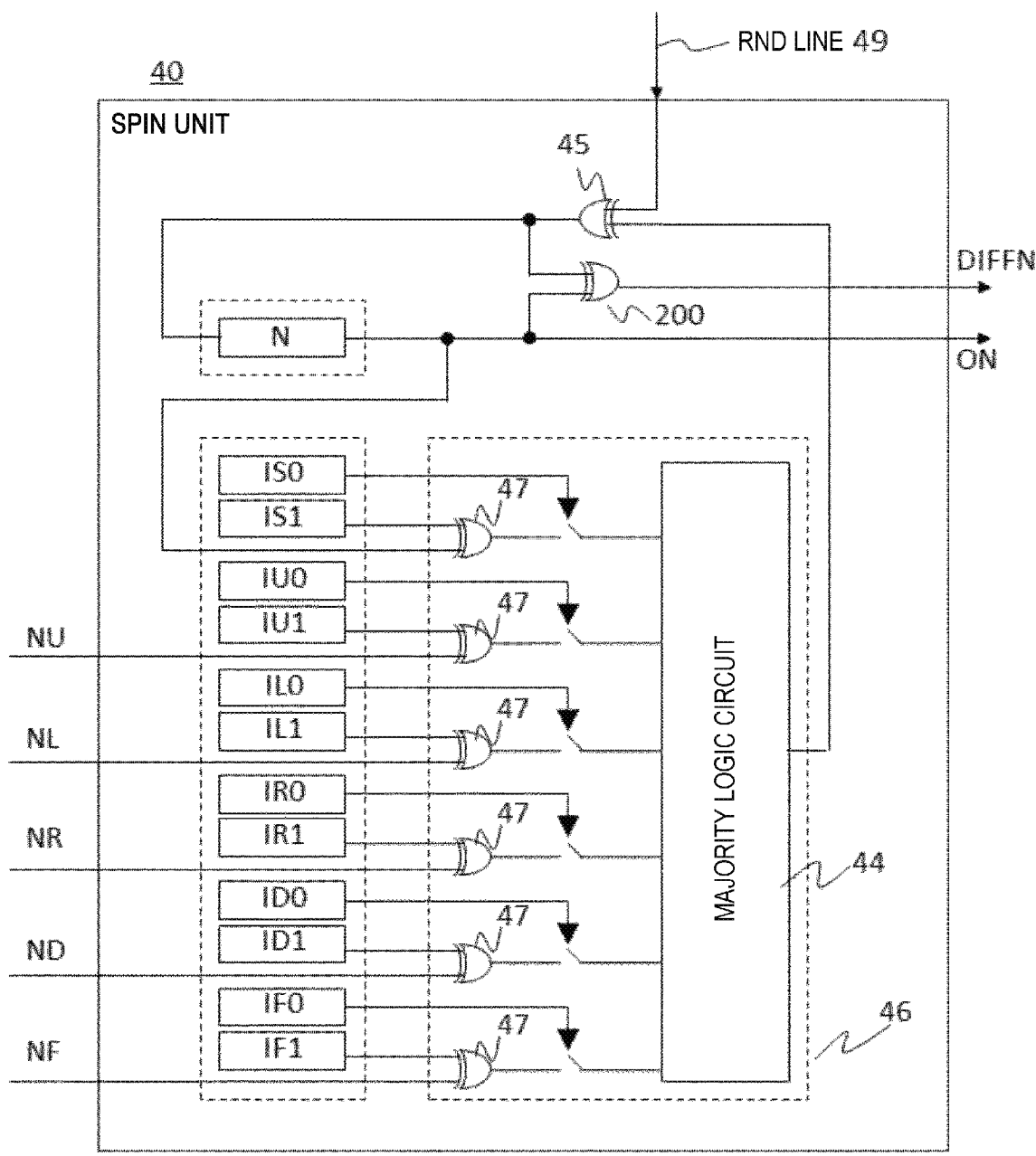
FIG. 5 is a block diagram showing a configuration of a spin unit according to a first embodiment.

FIG. 5 is a block diagram showing a configuration of the spin unit outputting spin value change information.

Figure 6:
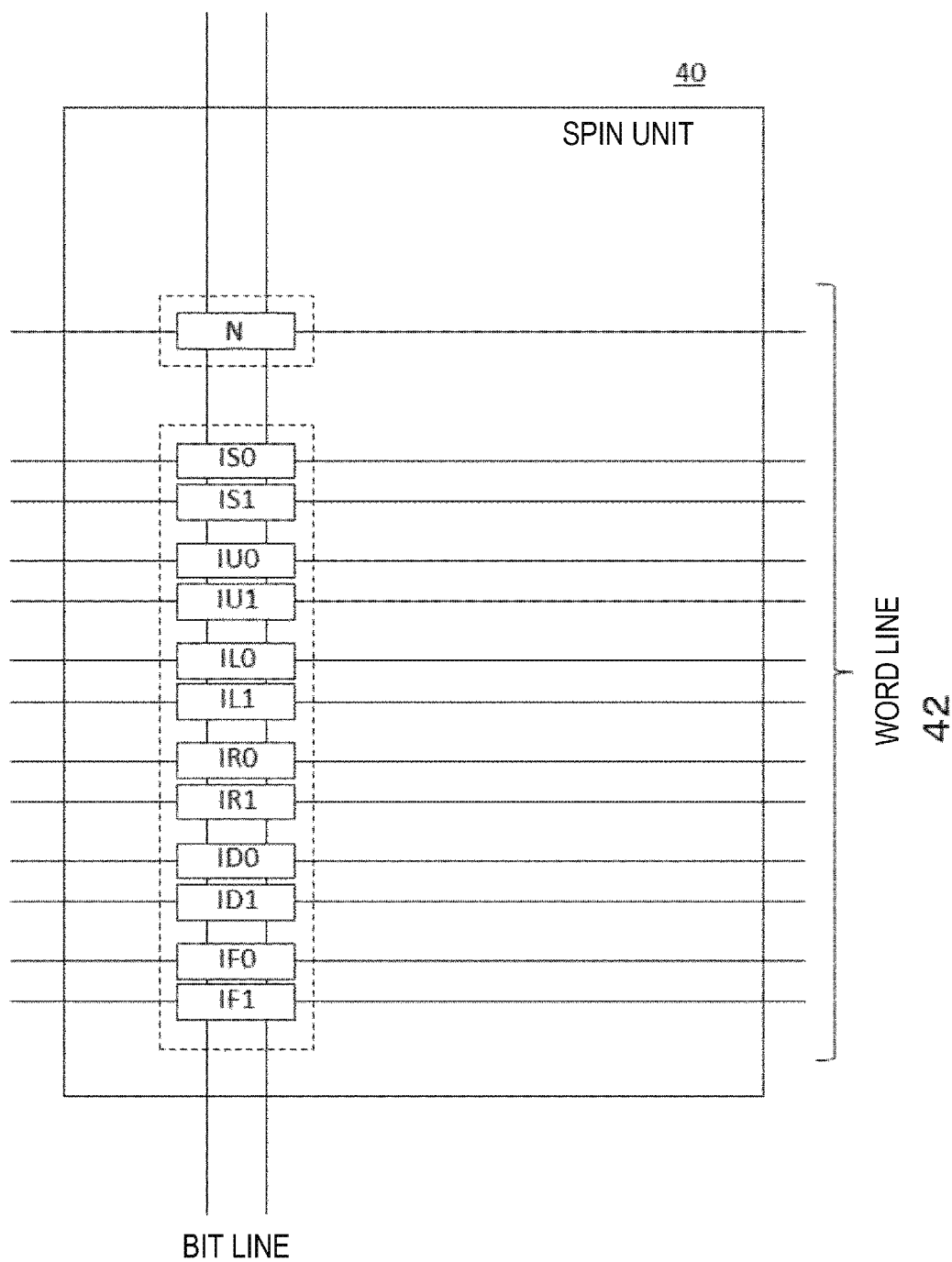
FIG. 6 is a block diagram showing a configuration of a spin unit according to the first embodiment.

FIG. 6 is a block diagram showing a configuration of the spin unit as a memory.

A configuration example of the spin unit 40 will be described with reference to FIG. 5 and FIG. 6. The spin unit 40 has two sides, which will be explained separately by using FIG. 5 and FIG. 6 as a matter of convenience; however, one spin unit 40 includes both configurations of FIG. 5 and FIG. 6. FIG. 5 illustrates a circuit for implementing interactions between the spin units 40 and FIG. 6 illustrates the configuration of the spin unit 40 by focusing on bit lines 41 and word lines 42 which are interfaces for accessing memory cells N, IS0, IS1, IU0, IU1, IL0, IL1, IR0, IR1, ID0, ID1, IF0, and IF1 included in the spin unit 40 from outside the Ising chip 13.

The spin unit 40 includes a plurality of 1-bit memory cells N, IS0, IS1, IU0, IU1, IL0, IL1, IR0, IR1, ID0, ID1, IF0, and IF1 for retaining the spin $\sigma_i$, the interaction coefficients $J_{j,i}$ to $J_{n,i}$, and the external magnetic field coefficient $h_i$ of the Ising model. Incidentally, two memory cells serve their role as a pair as follows: the memory cells IS0 and IS1, the memory cells IU0 and IU1, the memory cells IL0 and IL1, the memory cells IR0 and IR1, the memory cells ID0 and ID1, and the memory cells IF0 and IF1, and thus they will be hereinafter collectively referred to as the memory cell pair ISx, IUx, ILx, IRx, IDx, or IFx (see FIG. 7).

Here, the spin unit 40 will be described as a spin unit that represents the i-th spin. The memory cell N is a memory cell to represent a spin and retains a spin value. The spin value is +1/−1 (+1 may be expressed as up and −1 may be expressed as down) in the Ising model and this is made to correspond to 0/1 which is a binary value retainable by the memory cell. For example, +1 corresponds to 1 and −1 corresponds to 0.

Figure 7:
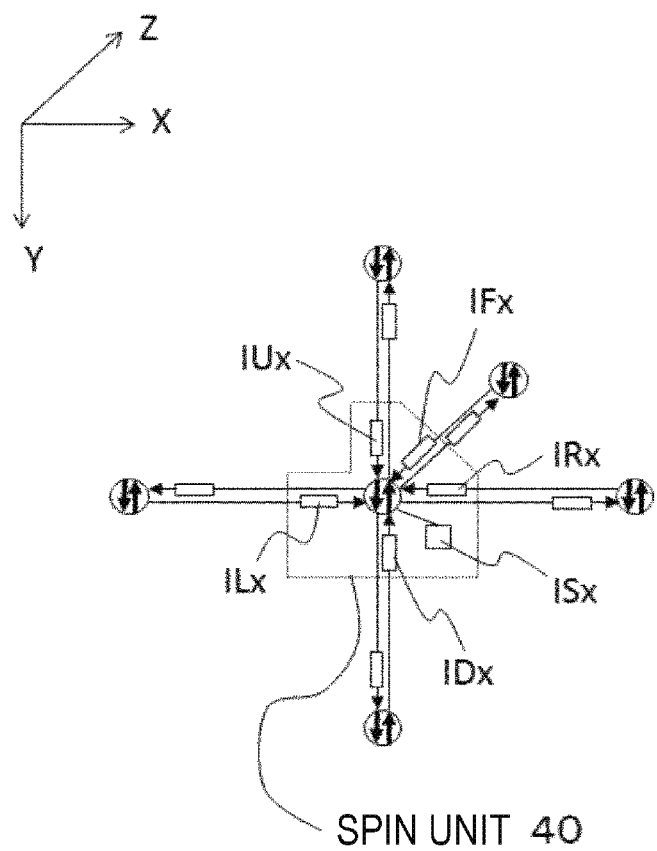
FIG. 7 is a conceptual diagram for describing a spin unit.

FIG. 7 is used to show a correspondence relationship between the memory cell pairs ISx, IUx, ILx, IRx, IDx, and IFx of the spin unit 40 and the topology of the Ising model shown in FIG. 4. The memory cell pair ISx stores an external magnetic field coefficient. Furthermore, each of the memory cell pairs IUx, ILx, IRx, IDx, and IFx stores an interaction coefficient. In particular, the memory cell pair IUx stores an interaction coefficient with an upper-side spin (−1 in an Y-axis direction); the memory cell pair ILx stores an interaction coefficient with a left-side spin (−1 in an X-axis direction); the memory cell pair IRx stores an interaction coefficient with a right-side spin (+1 in the X-axis direction); the memory cell pair IDx stores an interaction coefficient with a down-side spin (+1 in the Y-axis direction); and the memory cell pair IFx stores an interaction coefficient with a spin connected in a depthwise direction (+1 or −1 in a Z-axis direction).

Furthermore, when the Ising model is recognized as a directed graph and is seen from a certain spin, other spins have coefficients that influence the relevant spin. The coefficients by which the relevant spin influence the other spins belong to the respective other spins. In other words, the spin unit 40 is connected to five spins at maximum. With the Ising chip 13 according to the present embodiment, the external magnetic field coefficient and the interaction coefficients correspond to three values, +1/0/−1. Therefore, a 2-bit memory cell is required to represent each of the external magnetic field coefficient and the interaction coefficient.

The memory cell pairs ISx, IUx, ILx, IRx, IDx, and IFx represent the three values +1/0/−1 by using a combination of two memory cells whose number at the end of their reference signs is 0 or 1 (for example, in a case of the memory cell pair ISx, the memory cells IS0 and IS1), as shown in FIGS. 5 and 6. For example, in the case of the memory cell pair ISx, the memory cell IS1 represents +1/−1; and when a value retained by the memory cell IS1 is 1, it represents +1; and when the value retained by the memory cell IS1 is 0, it represents −1.

In addition, when the value retained by the memory cell IS0 is 0, the external magnetic field coefficient is recognized as 0; and the value retained by the memory cell IS0 is 1, either of +1/−1 determined by the value retained by the memory cell IS1 is recognized as the external magnetic field coefficient. When the external magnetic field coefficient is 0 and if it is assumed that the external magnetic field coefficient is disabled, it may be said that the value retained by the memory cell IS0 is an enable bit of the external magnetic field coefficient (the external magnetic field coefficient is enabled when IS0 is 1). Similarly, the memory cell pairs IUx, ILx, IRx, IDx, and IFx which store the interaction coefficients have the coefficients and the bit values correspond to each other.

Each of the memory cells N, IS0, IS1, IU0, IU1, IL0, IL1, IR0, IR1, ID0, ID1, IF0, and IF1 in the spin unit 40 needs to be designed so that data may be read therefrom or written thereto from the outside of the Ising chip 13. Thus, each spin unit 40 has the bit lines 41 and the word lines 42 as shown in FIG. 6.

Figure 8:
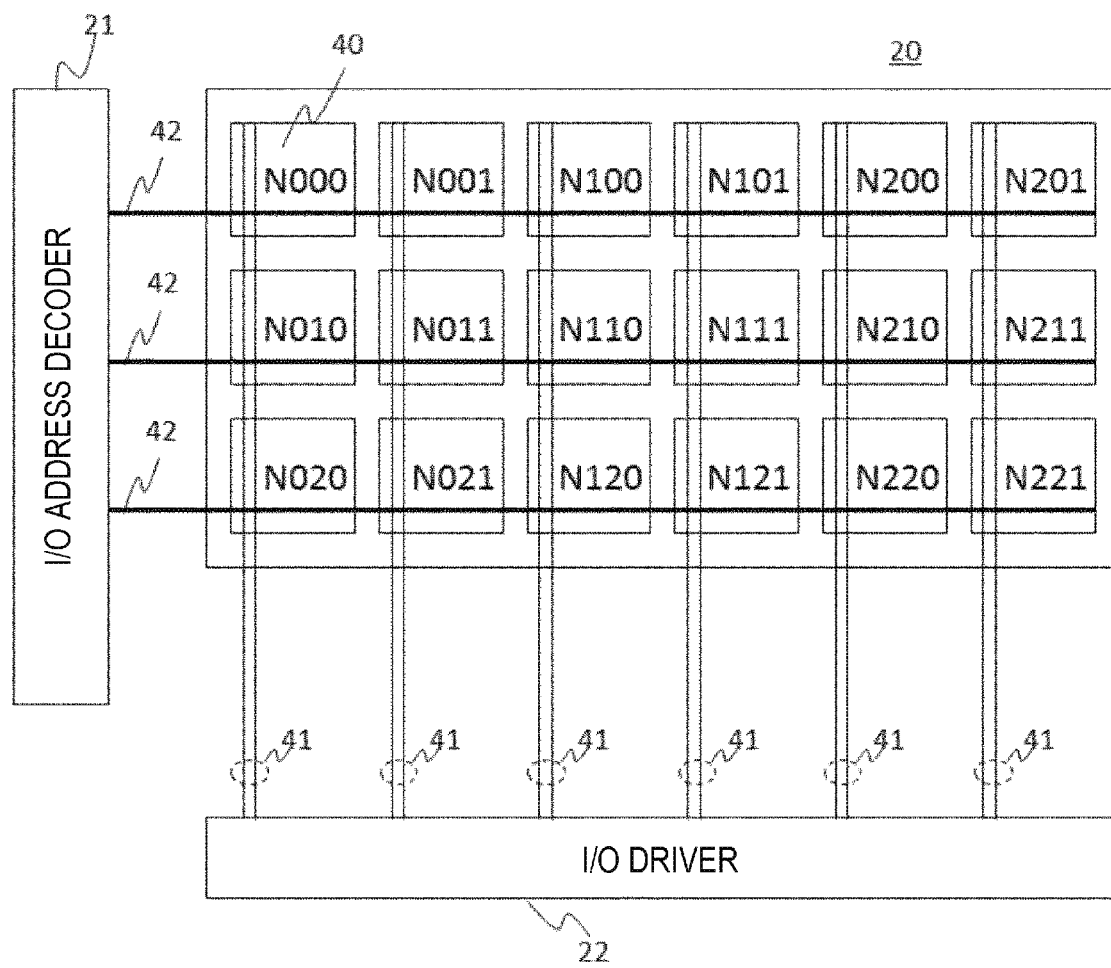
FIG. 8 is a block diagram of an arrangement example of spin units on an Ising chip.

FIG. 8 is a plan view showing a layout of the spin array 20 as a memory. With the Ising chip 13 as shown in FIG. 8, the spin units 40 are arranged in a tile-like manner on a semiconductor substrate and are each connected to the bit line 41 and the word line 42; and data may be read from or written to the memory cells in each spin unit 40 via the SRAM compatibility interface 30 of the Ising chip 13 in the same manner as in a case of a general SRAM by driving, controlling, or reading the spin units 40 using the I/O address decoder 21 and the I/O driver 22.

Figure 9:
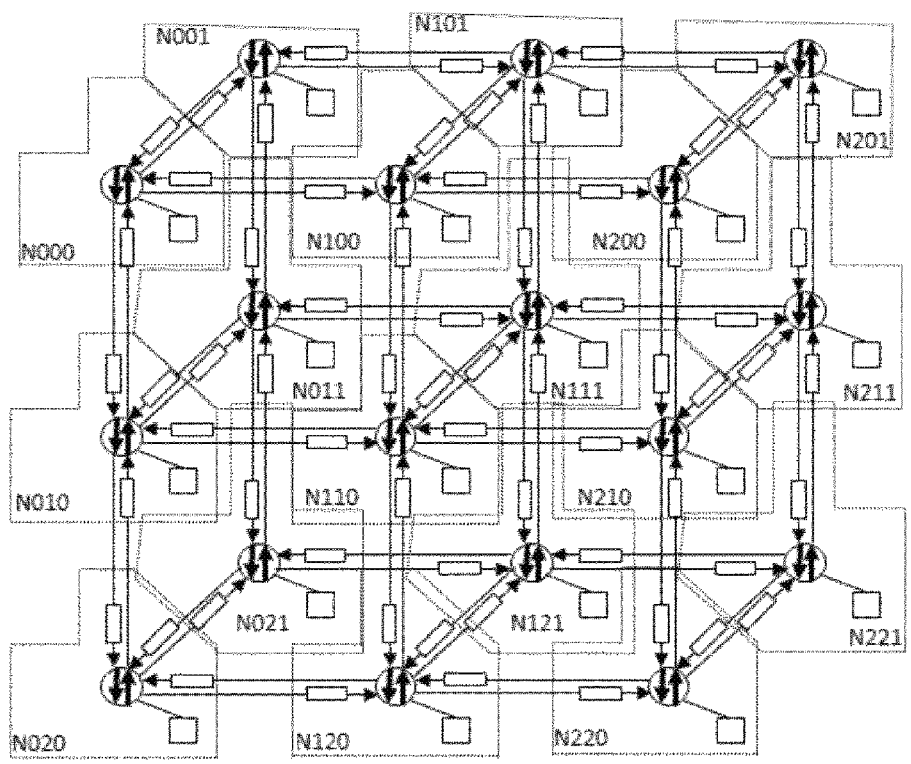
FIG. 9 is a conceptual diagram for describing a spin unit.

FIG. 9 is a conceptual diagram showing a correspondence between coordinates on a grid of FIG. 8 and a spin unit number. FIG. 9 shows which vertexes in the topology of the three-dimensional lattice the spin units represented in FIG. 8 (a reference numeral is assigned as, for example, Nxyz according to the position on the X-axis, the Y-axis, and the Z-axis) correspond to. Each lattice vertex is located as if to insert each lattice vertex of a Z-axis-directional lattice vertex array into a space between X-axis-directional lattice vertex arrays in order to locate the 3×3×2 three-dimensional lattice vertexes on a two-dimensional plane. In other words, while Nx0z, Nx1z, Nx2z, and so on are located in the Y-axis direction (the bottom side of the drawing is the Y-axis positive direction) on the two-dimensional plane in FIG. 9, spin units whose Z-axis direction coordinates are 0 and 1 are located alternately like N0y0, N0y1, N1y0, N1y1, N2y0, N2y1, and so on in the X-axis direction (the right side of the drawing is the X-axis positive direction).

Referring back to FIG. 5, in the present embodiment, since the spin units 40 are updated at the same time, each spin unit 40 independently has a circuit for determining a state of a next spin by calculating interactions. Referring to FIG. 5, the spin unit 40 has signal lines NU, NL, NR, ND, NF, ON, DIFFN, and RND as external interfaces.

The signal line ON shown in FIG. 5 is an interface for outputting the spin value retained by the relevant spin unit 40 to other spin units 40 (adjacent units in the topology in FIG. 4). As a result of calculating the interaction, the signal line DIFFN outputs whether the state is changed between a spin value N before the calculation and the next spin. A spin value before calculation (a value of the memory cell N) and an output of an XOR circuit 45, which is a result of calculating a state of a next spin, are input to an XOR circuit 200 to detect a change in a spin state. 1 is output when there is a change and 0 is output when there is no change.

Each of the signal lines NU, NL, NR, ND, and NF is an interface for inputting a spin value retained by each of the other spin units 40 (the adjacent units in the topology in FIG. 4). The signal line NU receives input from the upper-side spin (−1 in the Y-axis direction); the signal line NL receives input from the left-side spin (−1 in the X-axis direction); the signal line NR receives input from the right-side spin (+1 in the X-axis direction); the signal line ND receives input from the down-side spin (+1 in the Y-axis direction); and the signal line NF receives input from the spin connected in the depthwise direction (+1 or −1 in the Z-axis direction).

Regarding the spin unit 40, the next state of the relevant spin is determined so as to minimize energy between the adjacent spins. This is equivalent to determining either one of a positive value and a negative value is controlling with respect to a product of the adjacent spins and the interaction coefficients and the external magnetic field coefficient. For example, assuming that the spins $\sigma_j$, $\sigma_k$, $\sigma_l$, $\sigma_m$, and $\sigma_n$ are adjacent to the i-th spin $\sigma_i$, the next state of the spin $\sigma_i$ is determined as described below.

First, it is assumed that values of the adjacent spins are $\sigma_j$=+1, $\sigma_k$=−1, $\sigma_l$=+1, $\sigma_m$=−1, and $\sigma_n$=+1, the interaction coefficients are $J_{j,i}$=+1, $J_{k,i}$=+1, $J_{l,i}$=+1, $J_{m,i}$=−1, and $J_{n,i}$=−1, and the external magnetic field coefficient is $h_i$=+1. Products of the interaction coefficients and the adjacent spins and the external magnetic field coefficient under such a circumstance are as follows: $\sigma_j \times J_{j,i}$=+1, $\sigma_k \times J_{k,i}$=−1, $\sigma_l \times J_{l,i}$=+1, $\sigma_m \times J_{m,i}$=+1, $\sigma_n \times J_{n,i}$=−1, and $h_i$=+1. The external magnetic field coefficient may be considered as an interaction coefficient with a spin whose value is always +1.

Then, local energy between the i-th spin and the adjacent spins is obtained by multiplying each of the aforementioned coefficients by the i-th spin value and further inverting the sign. For example, the local energy with the j-th spin becomes: −1 when the i-th spin is +1; and +1 when the i-th spin is −1. Thus, the spins work in a direction to reduce the local energy under this circumstance when the i-th spin is +1.

When considering the local energy with respect to the external magnetic field coefficient between all the adjacent spins, the calculation is performed to find out which value of the i-th spin among +1 and −1, may reduce the energy. This may be done simply by counting the numbers of values +1 and −1 to see which is larger when the aforementioned products of the interaction coefficients and the adjacent spins and the external magnetic field coefficient are listed. In the above example, there are four +1 and two −1. When the i-th spin is +1, the sum of energy will be −2; and when the i-th spin is −1, the sum of energy will be +2. Accordingly, the next state of the i-th spin to minimize the energy may be determined by a majority of the spin values, that is, by deciding the next state of the i-th spin as +1 when the number of +1 is larger, and as −1 when the number of −1 is larger.

The logic circuit 46 shown in FIG. 5 is a circuit for performing the interactions described above. First, an XNOR circuit 47 is used to find an exclusive NOR (XNOR) of a state of adjacent spins and the values retained by the memory cells IU1, IL1, IR1, ID1, IF1 which indicate the interaction coefficients +1/−1. Accordingly, a next state of a relevant spin to minimize the energy may be calculated merely by considering its interactions (it is assumed that +1 is encoded as 1 and −1 is encoded as 0).

If the interaction coefficients are only +1/−1, the next state of the relevant spin may be determined by a majority logic, that is, by having a majority logic circuit 44 judge which is larger the number of +1 or the number of −1 among outputs from the XNOR circuit 47. Assuming that the external magnetic field coefficient corresponds to an interaction coefficient with a spin whose state is always +1, simply the value of the external magnetic field coefficient becomes a value that should be input to the majority logic circuit 44 which determines the next state of the spin.

Next, a method of realizing a coefficient 0 will be described. When there is a majority logic f with n inputs (I1, I2, I3, and so on up to In), the following proposition may be recognized as true. First, it is assumed that there are duplicates I'1, I'2, I'3, and so on up to I'n of inputs I1, I2, I3, and so on up to In (Ik=I'k for arbitrary k). In this case, an output from f (I1, I2, I3, and so on up to In) is equivalent to that of f to which the duplicates are also input (I1, I2, I3, and so on up to In and I'1, I'2, I'3, and so on up to I'n). In other words, even if two values are input as each input variable, an output will be invariant. Furthermore, it is assumed that, besides the inputs I1, I2, I3, and so on up to In, another input Ix and its inverted value !Ix exist. In this case, an output from f (I1, I2, I3, and so on up to In, Ix, !Ix) is equivalent to that of f (I1, I2, I3, and so on up to In). In other words, when the input variables and their inverted values are input, the function works to cancel influences of the input variables by a majority. The coefficient 0 is realized by making use of such a property of the majority logic.

In particular, as shown in FIG. 5, a duplicate of a candidate value of the next state of the relevant spin as mentioned above or inverted value thereof is simultaneously input to the majority logic circuit 44, depending on a value of the bit which determines enabling of the coefficient (the bit retained in each of the memory cells IS0, IU0, IL0, IR0, ID0, and IF0), by using an XOR circuit 48. For example, when a value of the bit retained by the memory cell IS0 is 0, the value of the bit retained in the memory cell IS1 and a value obtained by inverting the value of the bit retained by the memory cell IS1 are simultaneously input to the majority logic circuit 44. Thus, there will be no influence of the external magnetic field coefficient (the external magnetic field coefficient corresponds to 0). Furthermore, when the value of the bit retained by the memory cell IS0 is 1, the value of the bit retained by the memory cell IS1 and the same value (duplicate) as the above value are input simultaneously to the majority logic circuit 44.

A ground state search of the applied Ising model may be realized by energy minimization according to interactions between the spins, but performing only the ground state search may result in a local optimal solution. Basically, there are only movements in a direction to reduce the energy, and thus once the calculation results in the local optimal solution, it is impossible to get out of the local optimal solution and reach a global optimal solution. Accordingly, since the value of the memory cell, which represents spins, is stochastically inverted as an action to escape from the local optimal solution, the spin unit 40 includes an RND line 49 as an interface.

Then, the random number supplied from the random number generator 17 (FIG. 2) via the random number injection line 38 (FIG. 3) to the spin array 20 (FIG. 3) as mentioned earlier is supplied via the RND line 49 to the spin unit 40 and the random number is input to the XOR circuit 45, thereby stochastically inverting the spin value.

Figure 10:
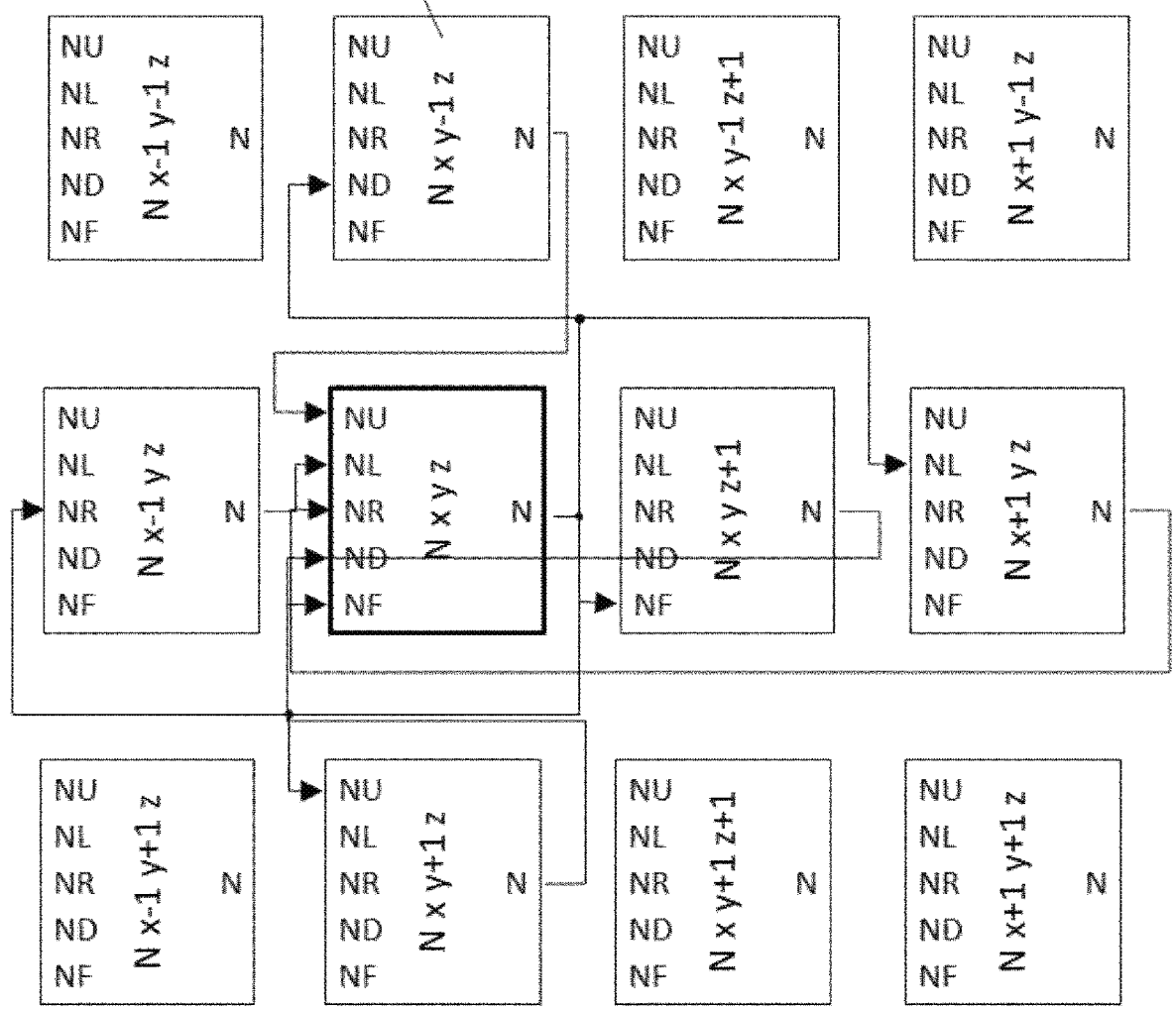
FIG. 10 is a block diagram showing an example of an inter-chip wire.

Also, FIG. 10 shows an example of wiring between the spin units 40 of NU, NL, NR, ND, and NF which are interfaces of the spin unit 40 shown in FIG. 5. FIG. 10 illustrates the wiring necessary to implement the topology as shown in FIG. 4 in the spin unit arrangement as shown in FIG. 8 when focusing on one certain spin unit 40 called "Nxyz". The topology in FIG. 4 may be implemented by performing such wiring for each spin unit 40.

<Method of Wiring Between Ising Chips in Multi-Ising Chip>

Next, a method of wiring between the Ising chips 13 (FIG. 2) in the multi-Ising chip 6 (FIG. 1) will be explained.

For example, when a large number of spin units 40 are to be mounted on a single Ising chip 13 to promote parallelization, the chip size of the Ising chip 13 increases, thereby resulting in a cost increase. Accordingly, when mounting a large number of spin units 40 on the multi-Ising chip 6, a method of mounting a plurality of Ising chips 13 on the multi-Ising chip 6 and connecting the Ising chips 13 via the inter-chip wire 14 is effective in order to prevent a cost increase.

In this case, the wiring of the pattern described with reference to FIG. 10 needs to be provided between the spin units 40 placed at the ends of the Ising chip 13 and the corresponding spin units 40 in another Ising chip 13. Accordingly, it is necessary to connect the corresponding spin units 40 provided at the chip ends of the respective adjacent Ising chips 13 via a connection unit 50, which constitutes a part of the inter-chip connector 24 (FIG. 3), and the inter-chip wire 14, for example, as shown in FIG. 11.

Here, the "spin units 40 provided at the chip ends" used herein denote spin units 40B when the spin units 40B that receive values of adjacent spin units 40A in the Ising model of FIG. 4 are spin units provided in an Ising chip 13B different from an Ising chip 13A where the spin units 40A are provided.

When the connection units 50 and the inter-chip wire 14 (FIG. 2) are formed to connect all the corresponding spin units 40 provided at the chip ends of the adjacent Ising chips 13, the number of the connection units 50 and the wiring amount of the inter-chip wire 14 will increase too much, thereby causing a cost increase and difficulty in implementation.

Figure 11:
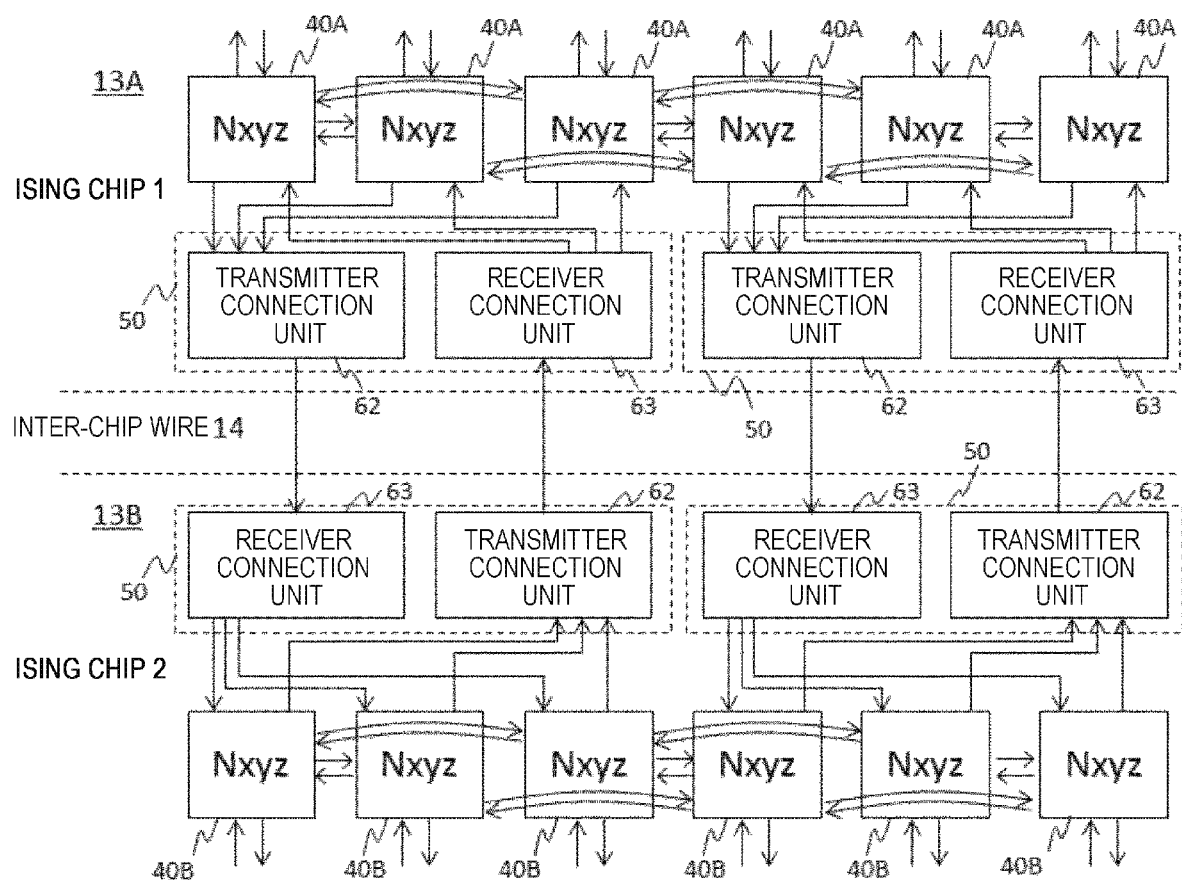
FIG. 11 is a block diagram showing an outline of an inter-chip connection.

FIG. 11 is a diagram schematically showing an inter-chip connection of the present embodiment. In the present embodiment, when values of spin units provided at the chip ends of the Ising chip 13A are transmitted to the adjacent Ising chip 13B, as shown in FIG. 11, the connection unit 50 is shared by a plurality of spin units (in the example of FIG. 11, three spin units), and then only a spin value of a spin unit whose spin value is changed is transmitted, thereby reducing the wiring amount of an inter-chip wire between the adjacent Ising chips 13 without largely deteriorating the accuracy of the ground state. However, it is not important how many spin units share the connection unit 50.

Figure 12:
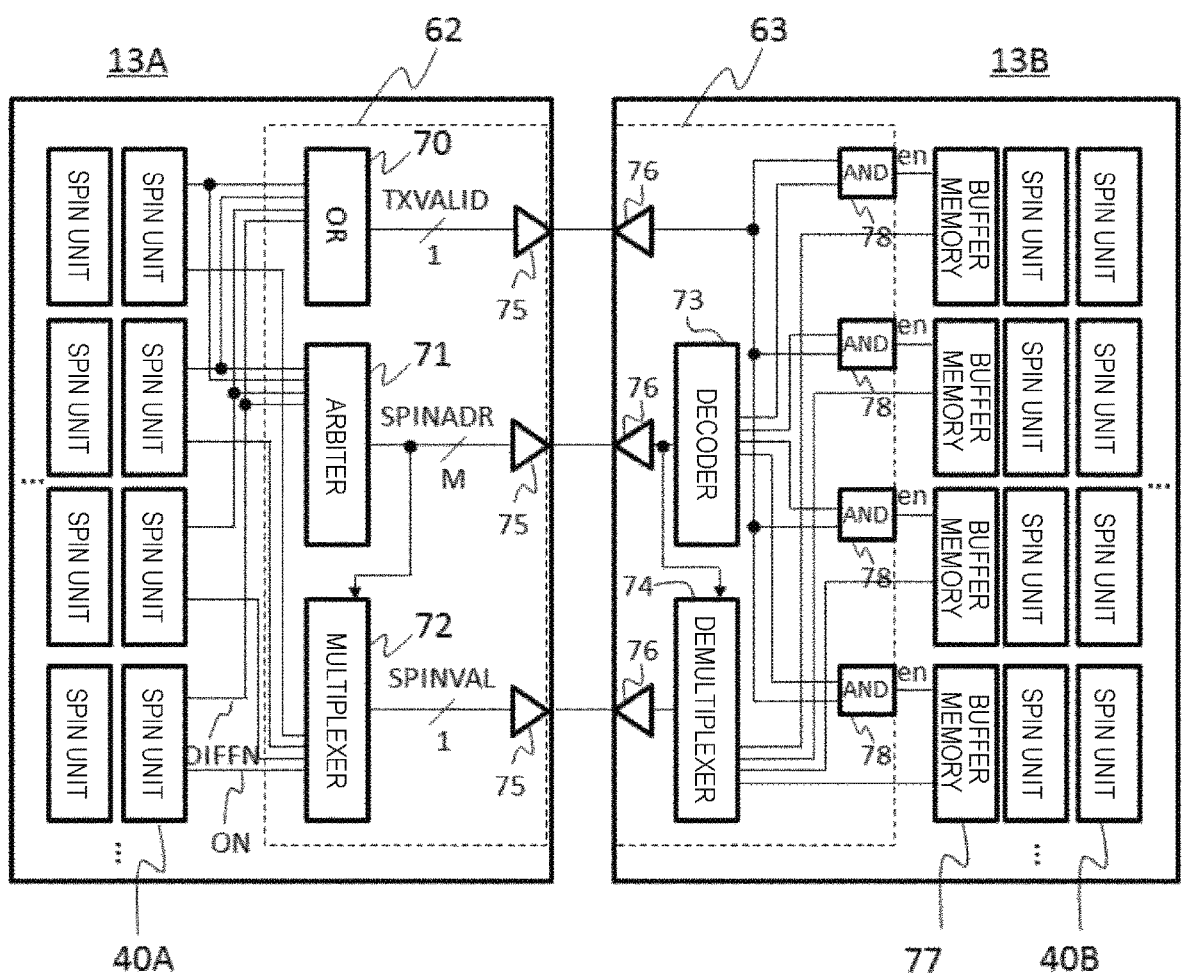
FIG. 12 is a block diagram of a configuration of an inter-chip connector.

FIG. 12 illustrates a detailed configuration of a portion for transmitting a spin value between the Ising chip 13A and the Ising chip 13B. For convenience of description, only a transmitter connection unit 62 of the Ising chip 13A on the left side of FIG. 12 and only a receiver connection unit 63 of the Ising chip 13B on the right side of FIG. 12 are shown, and only unidirectional transmission is shown. However, as shown in FIG. 11, each of the Ising chips 13 includes both the transmitter connection unit 62 and the receiver connection unit 62 as the connection unit 50.

The transmitter connection unit 62 of the Ising chip 13A includes an OR circuit 70, an arbiter 71, a multiplexer 72, and a driver 75. A value of the signal line DIFFN indicating that a spin value is changed among the outputs of the spin unit 40A at the chip end is input to the OR circuit 70 and the arbiter 71. As described above, 1 is output as the value of signal line DIFFN when the spin state is changed and 0 is output when there is no change.

At this time, when the value of any signal line DIFFN is 1, the signal line TXVALID indicating transmission of the valid spin value is 1. When there are a plurality of spin units whose value of the signal line DIFFN is 1, the arbiter 71 selects one of the spin units 40A to transmit the spin value via the inter-chip wire 14, and outputs a position thereof to the signal line SPINADR.

A configuration of the arbiter 71 will be described later.

A value of the signal line ON indicating a value of the spin unit 40A among the outputs of the spin unit 40A at the Ising chip end is input to the multiplexer 72. A signal for selecting an input of the multiplexer 72 uses the output of the arbiter 71. Accordingly, a spin value of the spin unit 40A selected by the arbiter 71 is output to the signal line SPINVAL. The driver 75 transmits the values of signal lines TXVALID, SPINADR, and SPINVAL to the adjacent Ising chip 13B via the inter-chip wire 14.

The receiver connection unit 63 includes a receiver 76, a decoder 73, a demultiplexer 74, an AND circuit 78, and a buffer memory 77 for recording a 1-bit value. The receiver 76 receives a signal transmitted from the transmitter connection unit 62 of the adjacent Ising chip 13A via the inter-chip wire 14. The value of the signal line TXVALID is input to the AND circuit 78. The value of the signal line SPINADR is input to the decoder 73 and outputs a value 1 only to a signal line indicating a position of the spin unit 40A of a transmission source. An output of the decoder 73 is input to the AND circuit 78. Also, the value of the signal line SPINADR is input to the multiplexer 74 as a selection signal. The value of the signal line SPINVAL is input to the demultiplexer 74 and the value input through the signal line SPINVAL is output only to the signal line indicating the position of the spin unit 40A of the transmission source.

Outputs of the AND circuit 78 and the demultiplexer 74 are each input to the buffer memory 77. The output of the AND circuit 78 is input to the buffer memory 77 as an enable signal, and the output of the demultiplexer 74 is input to the buffer memory 77 as a recorded value. Thus, since the value of the signal line TXVALID indicating that a valid value is transmitted is 1 and only the buffer memory 77 at a position where the output of the decoder 73 is 1 is enabled, a value of only the buffer memory 77 connected to the spin unit 40B at a position corresponding to the spin unit 40A of the transmission source is updated.

Here, the driver 75 and the receiver 76 may be configured by using, for example, LVDS or the like, which is a generally used transmission standard, but are not limited thereto.

Figure 13:
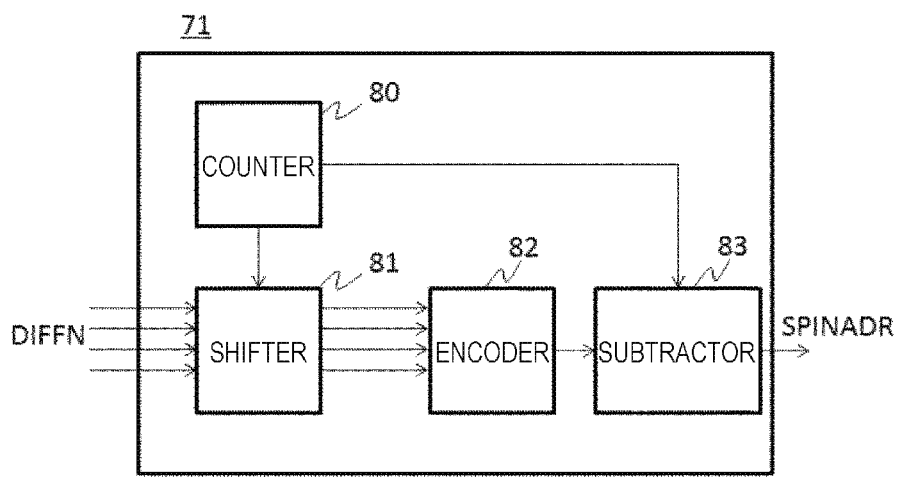
FIG. 13 is a block diagram of a configuration of an arbiter included in an inter-chip connector.

FIG. 13 shows a configuration example of the arbiter 71. The arbiter 71 includes a counter 80, a shifter 81, an encoder 82, and a subtractor 83. The arbiter 71 receives values of a plurality of signal lines DIFFN indicating that spin value of the spin unit 40 has changed, selects one signal line whose value is 1, and outputs a position of the selected signal line. Here, when values of a plurality of spin units 40 are changed, the selected spin unit 40 needs to be not biased. The counter 80 counts up every cycle in synchronization with an interaction clock, and returns to 0 when counting up to the number −1 of the signal line DIFFN. A value of an input signal line is barrel-shifted by the shifter 81 based on the value of the counter 80, and the encoder 82 outputs the position of the signal line whose value is 1. The subtractor subtracts the value of the counter from the output of the encoder 82 to output the position of the signal line whose value is 1 in an original input signal.

As such, the arbiter 71 changes the priority of selecting the spin units 40 whose spin value is changed every time such that the selected spin unit 40 is not biased. In addition, various methods, such as randomly selecting a spin unit by using a random number, may be used in order to prevent the selected spin unit 40 from being biased.

Figure 14:
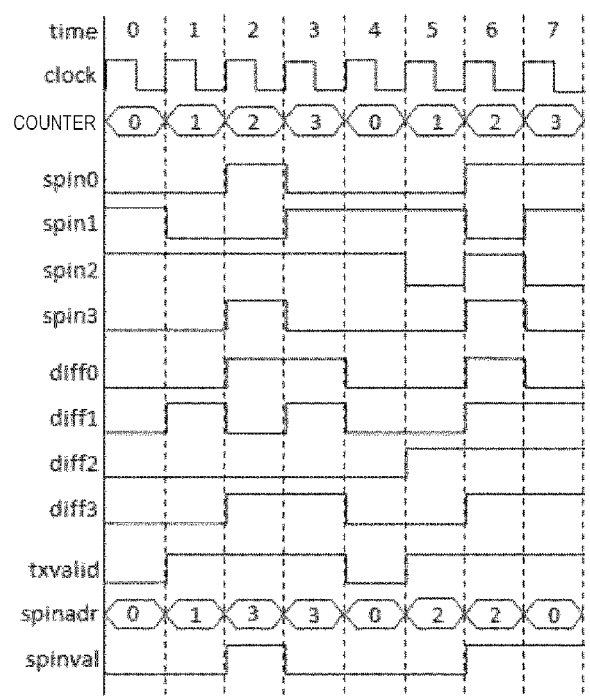
FIG. 14 is a timing chart for explaining an operation of a transmitter connection unit.

FIG. 14 is a timing chart for explaining an operation of a transmitter connection unit shown in FIG. 12. In this example, four spin units are connected to a transmitter connection unit. A counter indicates a value of the counter included in the arbiter 71. spin0, spin1, spin2, and spin3 are each a spin value of the spin unit 40 to be transmitted. diff0, diff1, diff2, and diff3 are each a value indicating whether a spin value of the spin unit 40 to be transmitted is changed. TXVALID, SPINADR, and SPINVAL are each a value of a signal line of the same name as the transmitter connection unit 62 shown in FIG. 12.

Since only diff1 is 1 at time 1, 1 is output to SPINADR. At time 2, two of diff 0 and diff 3 are 1, but since a value of the counter is 2, an output of SPINADR is 3 in order to find a position of the signal line of value 1 with diff 2 at the beginning. Similarly at each of times 5, 6, and 7, the position of the signal line whose value is 1 is searched for based on the value of the counter at the time and the position is output. On the other hand, since there is no spin whose value is changed at time 4, the value of TXVALID becomes 0. Since the value of this time is ignored on the receiving side, the values of SPINADR and SPINVAL have no meaning but output 0.

Figure 15:
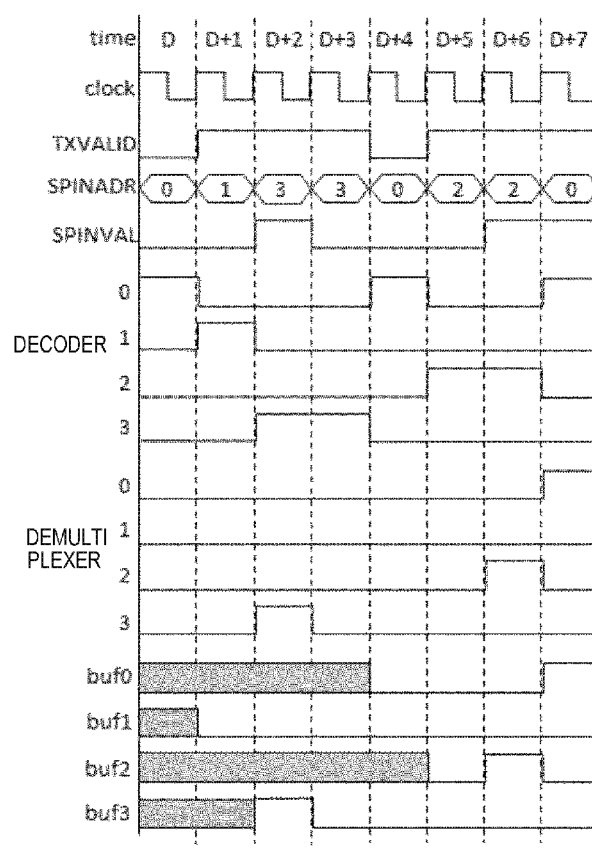
FIG. 15 is a timing chart for explaining an operation of a receiver connection unit.

FIG. 15 shows a transmission example of a reception side spin value. An operation where a signal transmitted by the transmitter connection unit 62 shown in the example of FIG. 14 is received is shown. Since a value transmitted at time 0 by the transmitter connection unit 62 reaches the receiver connection unit 63 after the lapse of a predetermined delay time (hereinafter, D), the time in an upper portion of the timing chart of FIG. 15 is described with the time D as a starting point. Signals described as decoders 0, 1, 2, and 3 correspond to output signals of the decoder 73. In a decoder, only an output corresponding to the value of the signal line SPINADR is 1. For example, at time D+1, since the value of the signal line SPINADR is 1, only the decoder 1 becomes 1 and the decoders 0, 2, and 3 become 0.

Signals described as demultiplexers 0, 1, 2, and 3 correspond to output signals of the demultiplexer 74. The demultiplexers 0, 1, 2, and 3 output the value of the signal line SPINVAL to the corresponding signal line. In this example, an output that does not correspond to a selection signal is 0. For example, at time D+2, since SPINADR is 3 and SPIN- VAL is 1, an output of the demultiplexer 3 is 1 and an output of the demultiplexers 0, 1, and 2 is 0.

Buf0, buf1, buf2, and buf3 each denote a value recorded in the buffer memory.

In this example, in order to clearly indicate a timing at which a value transmitted from the transmitter connection unit is stored in the buffer memory, a value before the value reaches from the transmitter connection unit is indeterminate for the sake of convenience and is indicated by gray shading.

<Multi-Ising Chip Control Procedure>

Figure 16:
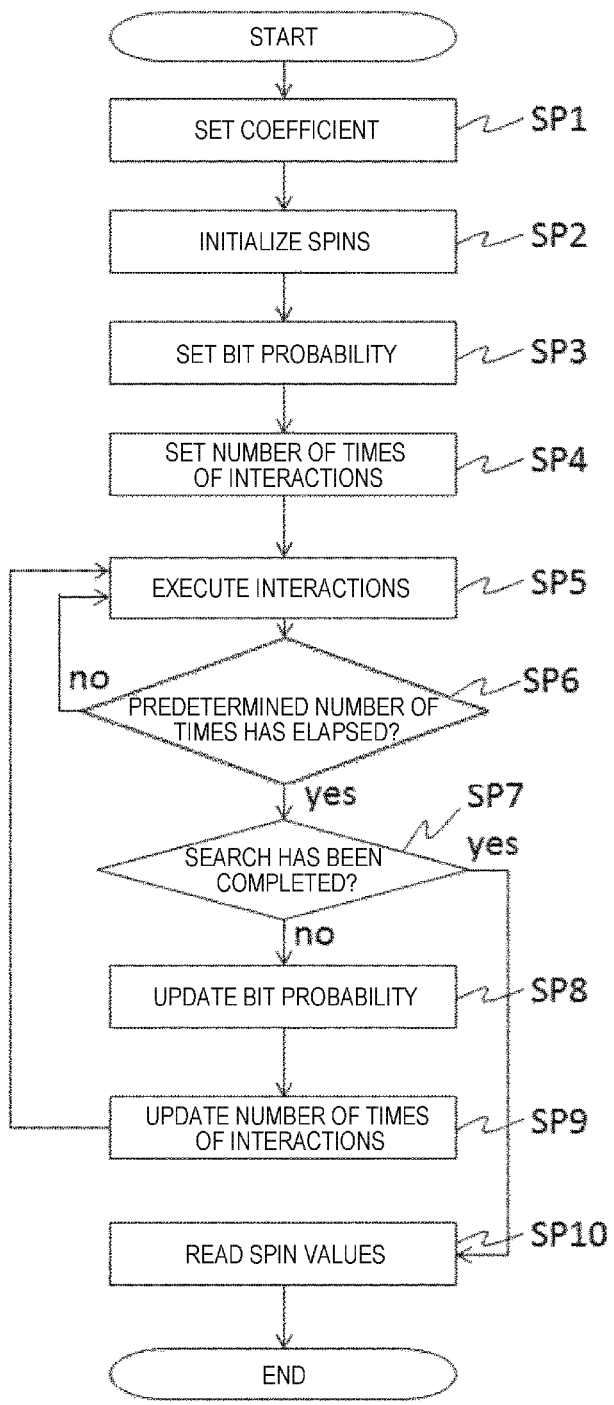
FIG. 16 is a flowchart illustrating a processing sequence for ground state search processing.

FIG. 16 illustrates a processing sequence for ground state search processing executed by the CPU 3 (FIG. 1) for the information processing unit 1. The CPU 3 executes the ground state search on these Ising chips 13 by controlling the Ising chips 13 in a necessary multi-Ising chip 6 (FIG. 2) via the controller 15 (FIG. 2) for that multi-Ising chip 6 based on the multi-Ising chip control program 9 (FIG. 1) in accordance with the processing sequence shown in FIG. 16.

Here, the CPU 3 controls the Ising chip 13 in each multi-Ising chip 6 and the spin unit 40 in the Ising chip 13 via the controller 15 (FIG. 2) in the multi-Ising chip 6; and the following explanation will be given by ignoring the existence of the controller 15 as necessary in order to facilitate understanding.

When starting the ground state search processing in response to a user's instruction or the like, the CPU 3 first converts the problem data 7 (FIG. 1) into an Ising model format according to the problem conversion program 8 (FIG. 1) and divides the converted problem into partial problems as necessary, and sets an interaction coefficient and an external magnetic field coefficient of the partial problem to each spin unit 40 of each Ising chip 13 of the required multi-Ising chip 6 (SP1).

Subsequently, the CPU 3 determines the spin value, which should be retained by each spin unit, according to the random number and initializes the spin value of each spin unit 40 in each Ising chip 13 at the multi-Ising chip 6 so that the spin value becomes the determined spin value (SP2).

Next, the CPU 3 sets probability at which the random number "1" is generated by the random number generator 17 (FIG. 2) in each predetermined multi-Ising chip 6 (hereinafter referred to as a bit probability) (SP3). In the present embodiment, the bit probability of the random number generated by the random number generator 17 is set high at the beginning and the bit probability is then made to decrease in a stepwise manner. As a result, the spin value retained by each spin unit 40 may be easily inverted at the beginning and then it gradually becomes difficult to invert that spin value (it may easily converge to "0" or "1"). Therefore, in step SP3, the bit probability at each of the above-mentioned steps is set.

Subsequently, the CPU 3 executes an interaction operation once at each spin unit 40 in each Ising chip 13 by, for example, driving the interaction clock generator 16 (FIG. 2) of the multi-Ising chip 6 (SP5); and then determines whether the execution of the interaction operation has been completed as many times as set for the current bit probability (SP6). Then, if the CPU 3 obtains a negative result in the determination, the CPU 3 returns to step SP5 and then repeats the processing in step SP5 and step SP6.

Then, if the CPU 3 eventually obtains an affirmative result in step SP6 by executing the interaction operation as many times as set for the currently set bit probability, the CPU 3 determines whether the execution of all the execution operations for each bit probability set in step SP4 have been completed (SP7).

If the CPU 3 obtains a negative result in the determination, the CPU 3 updates the bit probability to a predetermined bit probability lower than the current bit probability (SP8) and then updates the number of times of the interaction operation to be executed to a predetermined number of times (SP9). Subsequently, the CPU 3 returns to step SP5 and then repeats the processing from step SP5 to step SP9.

Then, if the CPU 3 eventually obtains an affirmative result in step SP7 by completing the execution of all the interaction operations for each bit probability set in step SP4, the CPU 3 reads the spin value retained by each spin unit 40 in each Ising chip 13 of the then-targeted multi-Ising chip (SP10) and then terminates the ground state search processing.

<Effect of Present Embodiment>

As described above, the information processing apparatus 1 according to the present embodiment transmits only a spin value of a spin unit whose value is changed between the Ising chips 13 in the multi-Ising chip 6. Accordingly, the wiring amount of the inter-chip wire 14 connecting the Ising chips 13 may be reduced. Also, as compared with the case where spin values of all spin units are time-divisionally transmitted via limited inter-chip wires, high-speed transmission becomes possible. Thus, according to the present embodiment, it is possible to implement the multi-Ising chip 6 that may search a ground state of a large-scale Ising model and be manufactured easily at inexpensive cost.

Second Embodiment

As described with reference to FIG. 16 of the first embodiment, when the ground state search is performed by using the multi-Ising chip 6, control is performed such that the bit probability is set high in the beginning and is gradually decreased.

Figure 17:
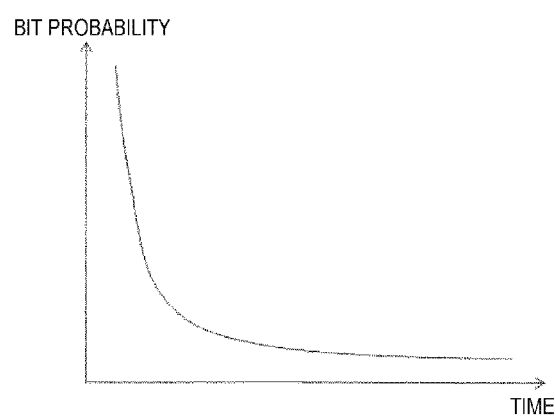
FIG. 17 is a conceptual diagram for explaining temperature control during a ground state search.

FIG. 17 is a graph showing an example of a relationship between time and bit probability. When the bit probability is high, a spin value at the end of the Ising chip 13 frequency changes, but when the bit probability decreases, the spin value at the end of the Ising chip 13 barely changes. As described in the first embodiment, in the case where a value is transmitted when a spin value changes, when the amount of the inter-chip wire 14 is determined in accordance with a low bit probability, the change in the spin value may be unable to be transmitted when the bit probability is high. In this case, the number of times the spin value retained in the buffer memory 77 included in the receiver connection unit 63 changes is smaller than the actual number. On the other hand, since the spin value randomly changes when the bit probability is high, it is not always necessary to determine an accurate spin value of the adjacent Ising chip 13.

Accordingly, when the bit probability is high, an output of a random number generator provided in the Ising chip is used instead of a spin value transmitted from the adjacent Ising chip 13 via the inter-chip wire 14, and the spin value of the adjacent Ising chip is transmitted via the inter-chip wire only when the bit probability is low, thereby expecting the improvement in the accuracy without substantially increasing the quantity.

Figure 18:
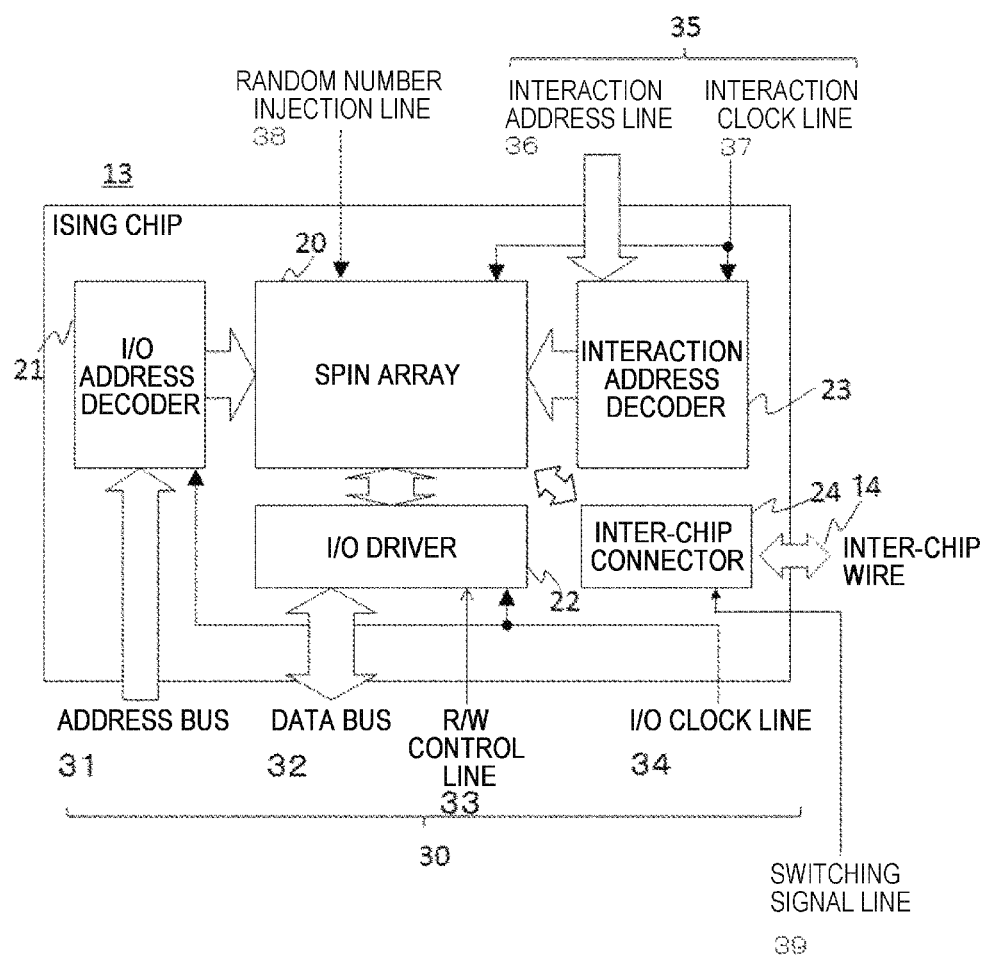
FIG. 18 is a block diagram showing a configuration of an Ising chip according to a second embodiment.

FIG. 18 shows a configuration of the Ising chip 13 according to the second embodiment. Elements denoted by the same reference numerals are same as those included in the first embodiment. A switching signal line 39 is provided as an input to the spin array. The switching signal line 39 is input to the inter-chip connector 24. In the inter-chip connector 24, a value of a switching signal is used to switch inputting of a spin value transmitted from the adjacent Ising chip 13 via the inter-chip wire 14 to a spin unit at the end of the Ising chip 13 and inputting of a random number.

Figure 19:
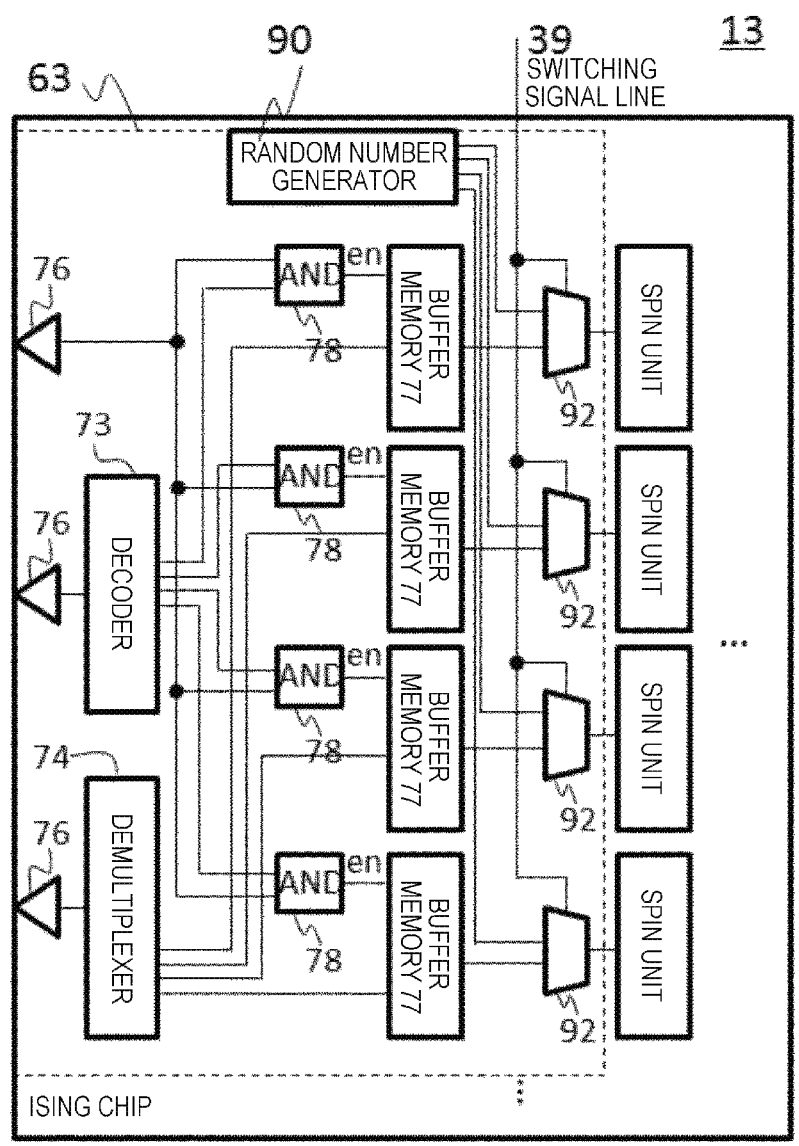
FIG. 19 is a block diagram showing a configuration example of a spin value receiving unit according to the second embodiment.

FIG. 19 is a block diagram showing a configuration of the receiver connection unit 63 according to the second embodiment. In addition to the configuration described in the first embodiment, the receiver connection unit 63 further includes a random number generator 90 and a multiplexer 92, and the switching signal line 39 is provided as an external input. The random number generator generates a random number with a bit probability of 50% in synchronization with the interaction clock. The multiplexer 92 inputs an output of the random number generator and a value recorded in the buffer memory 77, and sets a value of the switching signal line 39 as a selection signal. Accordingly, a value appropriate according to the bit probability may be supplied to the spin unit 40 at the end of the Ising chip 13 according to the value of the switching signal. Although one random number generator 90 is provided in the Ising chip 13 in FIG. 19, a plurality of random number generators may be provided in an Ising chip, or one random number generator may be shared by a plurality of Ising chips.

Figure 20:
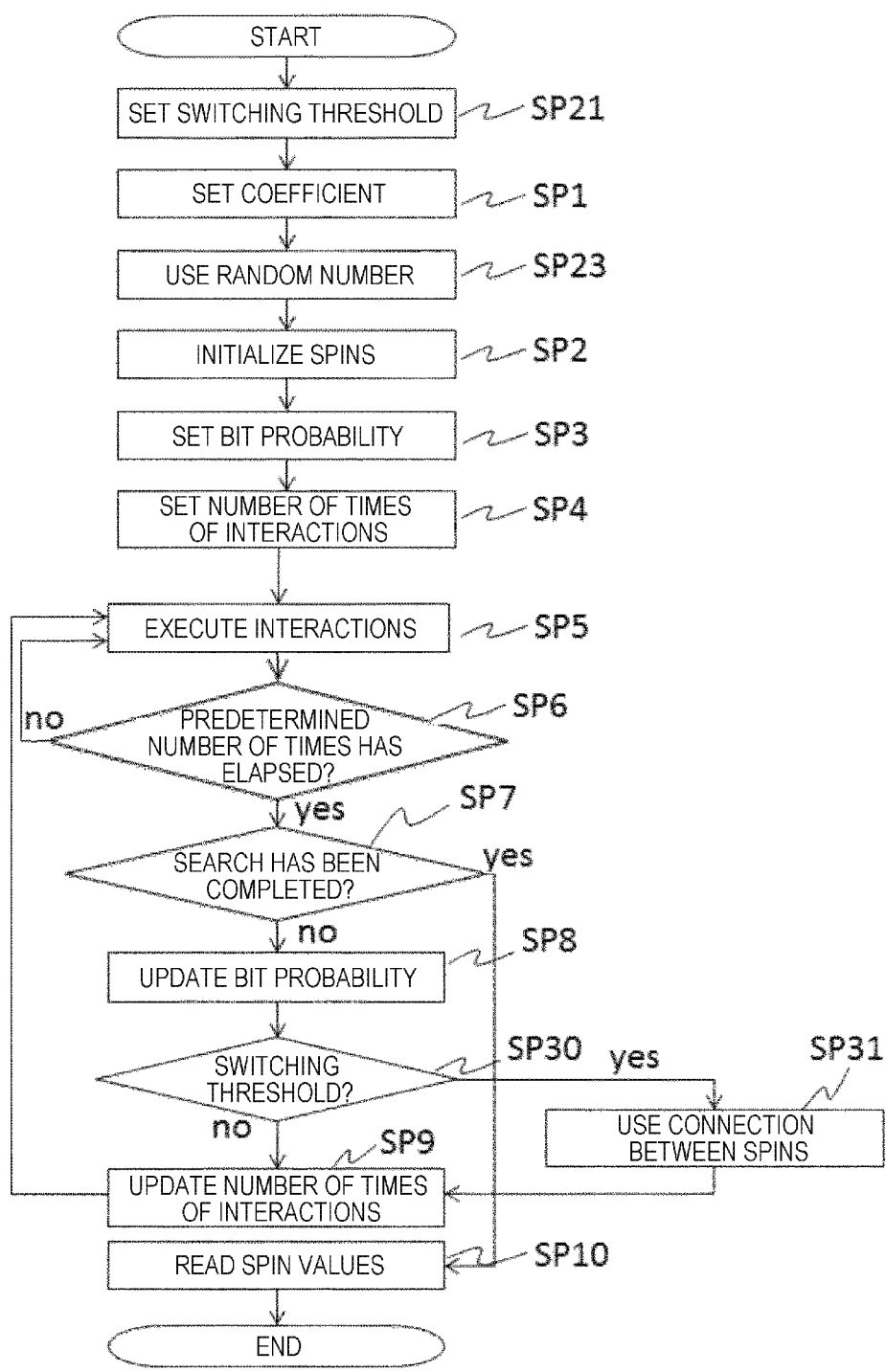
FIG. 20 is a flowchart showing another sequence of a ground state search.

FIG. 20 shows a control procedure according to the second embodiment. Steps denoted by the same step number perform the same processing as in FIG. 16. According to a user's instruction, the CPU 3 determines a switching threshold of the bit probability to switch between using the random number or using the value transmitted from the transmitter connection unit 62 at the receiver connection unit 63 (SP21). The CPU 3 sets a value such that the receiver connection unit 63 of each Ising chip 13 uses a random number on the switching signal line 39 input to the multi-Ising chip (SP23). When updating the bit probability, the CPU 3 determines whether the updated bit probability is lower than the bit probability determined in step SP21 (SP30). When a positive result is obtained in the determination, the CPU 3 sets a value to the switching signal line such that the receiver connection unit 63 of each Ising chip 13 uses the spin value transmitted from the transmitter connection unit 62 (SP31).

<Effect of Second Embodiment>

It is possible to approximate the distribution of spin values of a buffer memory of a receiver connection unit approximately to the actual spin value even when bit probability is high and a spin value frequently changes, and thus the improvement of accuracy is expected. Also, since an inter-chip connection is not used when the bit probability is high, power consumption related to inter-chip transmission may be reduced by stopping the inter-chip connection during the corresponding period.

According to the present embodiment, since required spin values are transmitted and received between Ising chips while being spatially or temporally thinned, the wiring amount of inter-chip wires connecting the Ising chips may be reduced accordingly. According to the present embodiment, a ground state of a large-scale Ising model may be searched, and a semiconductor device which may be manufactured at low cost and easily may be realized. The present invention may be widely applied to a semiconductor device that performs a ground state search of an Ising model.

What is claimed is:

1. An information processing apparatus provided with a plurality of spin units for storing spin states and searching for a predetermined state by updating a spin state of a spin unit based on spin states of other spin units, the information processing apparatus comprising:
   a first semiconductor integrated circuit device in which a plurality of first spin units are formed;
   a second semiconductor integrated circuit device in which a second spin unit is formed;
   an inter-chip wire connecting the first semiconductor integrated circuit device and the second semiconductor integrated circuit device; and
   a transmitter connection unit connected to the inter-chip wire and simultaneously shared by the plurality of first spin units,
   wherein the transmitter connection unit transmits a spin state of a spin unit of which the spin state is changed among the plurality of first spin units, to the second semiconductor integrated circuit device through the inter-chip wire.

2. The information processing apparatus according to claim 1, wherein
   each of the plurality of first spin units includes a detection circuit for detecting a change in its own spin state and a signal line for transmitting an output of the detection circuit to the transmitter connection unit, and
   the transmitter connection unit transmits the spin state of the spin unit of which the spin state is changed to the second semiconductor integrated circuit device through the inter-chip wire when even one of outputs of the detection circuits transmitted from the plurality of first spin units indicates a change in a spin state.

3. The information processing apparatus according to claim 2, wherein
   the transmitter connection unit includes an arbiter for selecting one of the plurality of first spin units when a plurality of outputs of the detection circuits transmitted from the plurality of first spin units indicate a change in a spin state, and transmits a spin state of a selected spin unit to the second semiconductor integrated circuit device through the inter-chip wire.

4. The information processing apparatus according to claim 3, wherein
   each of the plurality of first spin units includes a signal line for transmitting its own spin state to the transmitter connection unit,
   the transmitter connection unit includes a multiplexer for receiving a plurality of spin states transmitted from the plurality of first spin units and outputting one spin state among the plurality of spin states, and
   the multiplexer determines a spin state to be output according to an instruction of the arbiter.

5. The information processing apparatus according to claim 4, wherein
   the arbiter changes a priority to be selected at a predetermined timing when selecting one of the plurality of first spin units.

6. The information processing apparatus according to claim 1, wherein
   the transmitter connection unit includes:
   a multiplexer for transmitting a spin state of a spin unit of which the spin state is changed to the second semiconductor integrated circuit device through the inter-chip wire;
   an arbiter for transmitting information for specifying a first spin unit having the transmitted spin state to the second semiconductor integrated circuit device through the inter-chip wire; and
   a logic circuit for transmitting a signal indicating transmission of an effective spin value to the second semiconductor integrated circuit device through inter-chip wire.

7. The information processing apparatus according to claim 6, wherein the second semiconductor integrated circuit device includes:
a demultiplexer for receiving the spin state through the inter-chip wire;
a decoder for receiving the information specifying the first spin unit through the inter-chip wire;
a plurality of AND circuits for receiving the signal indicating the transmission of the effective spin value through the inter-chip wire and receiving an output of the decoder; and
a plurality of buffer memories provided in an one-to-one manner with the plurality of AND circuits and for receiving an output of the demultiplexer, and
the plurality of buffer memories store an output of the demultiplexer by using an output of the plurality of AND circuits as an enable signal.

8. The information processing apparatus according to claim 1, wherein
the second semiconductor integrated circuit device includes a selector for selecting a spin state and a random number transmitted from the transmitter connection unit through the inter-chip wire and inputting the spin state and the random number to the second spin unit.

9. The information processing apparatus according to claim 8, wherein
the second semiconductor integrated circuit device includes a random number generator and a switching signal line, and
the selector selects a random number supplied from the random number generator and a spin state transmitted through the inter-chip wire according to a signal of the switching signal line.

10. The information processing apparatus according to claim 9, wherein
the information processing apparatus controls an inversion probability of randomly inverting a spin value to be lowered with the lapse of time to escape a local solution while searching for the predetermined state, and
the switching signal line causes the selector to select the random number supplied from the random number generator when the inversion probability is high and causes the selector to select the spin state transmitted through the inter-chip wire when the inversion probability is low.

11. A semiconductor integrated circuit device having a spin array formed of a plurality of spin units, wherein
each of the spin units includes:
a first memory cell for storing a value expressing a state of one spin;
a second memory cell for storing an interaction coefficient indicating an interaction from another spin interacting with the one spin;
a logic circuit for determining a next state of the one spin based on a value representing a state of the other spin and the interaction coefficient; and
a detection circuit for detecting whether the next state of the spin differs from a current spin state,
the plurality of spin units share one transmitter connection unit,
the transmitter connection unit includes:
a multiplexer for inputting contents of the first memory cells of the plurality of spin units and selecting one of the contents; and
an arbiter for receiving, as inputs, outputs of the detection circuits of the plurality of spin units, and
the multiplexer selects one of the contents of the first memory cells according to an output of the arbiter and outputs the selected content to the outside of the semiconductor integrated circuit device.

12. The semiconductor integrated circuit device according to claim 11, wherein
the arbiter changes a priority of a spin unit to be selected at a predetermined timing when the multiplexer selects one of the contents of the first memory cells.

13. The semiconductor integrated circuit device according to claim 11, wherein
the plurality of spin units include:
a demultiplexer for inputting a value expressing a state of another spin input from the outside of the semiconductor integrated circuit device;
a plurality of buffers; and
a decoder for designating a buffer for storing an output of the demultiplexer.

14. The semiconductor integrated circuit device according to claim 13, further comprising a selector for selecting contents of the plurality of buffers and a random number and supplying the selected contents and random number to the plurality of spin units.

* * * * *